United States Patent
Lim et al.

(10) Patent No.: US 9,029,838 B2
(45) Date of Patent: May 12, 2015

(54) METHODS OF FORMING INCLINED STRUCTURES ON INSULATION LAYERS, ORGANIC LIGHT EMITTING DISPLAY DEVICES AND METHODS OF MANUFACTURING ORGANIC LIGHT EMITTING DISPLAY DEVICES

(75) Inventors: Jae-Ik Lim, Yongin (KR); Won-Sang Park, Yongin (KR); Soo-Min Baek, Yongin (KR); Min-Woo Kim, Yongin (KR); Il-Nam Kim, Yongin (KR); Jae-Kyoung Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 7 days.

(21) Appl. No.: 13/530,057

(22) Filed: Jun. 21, 2012

(65) Prior Publication Data

US 2013/0001603 A1    Jan. 3, 2013

(30) Foreign Application Priority Data

Jun. 29, 2011 (KR) .......................... 10-2011-0063558
Jun. 1, 2012  (KR) .......................... 10-2012-0059068

(51) Int. Cl.
  *H01L 51/52*   (2006.01)
  *H01L 27/32*   (2006.01)

(52) U.S. Cl.
  CPC ........ *H01L 51/5225* (2013.01); *H01L 51/5262* (2013.01); *H01L 51/5209* (2013.01); *H01L 27/3246* (2013.01); *H01L 27/3258* (2013.01)

(58) Field of Classification Search
  CPC ............ H01L 51/5271; H01L 27/3246; H01L 27/3258; H01L 51/5209; H01L 51/5225; H01L 51/5262
  USPC .............................................. 257/40, E51.018
  See application file for complete search history.

(56) References Cited

U.S. PATENT DOCUMENTS

| 6,881,501 | B2 | 4/2005 | Yudasaka |
| 8,049,405 | B2 | 11/2011 | Adachi et al. |
| 8,125,145 | B2 | 2/2012 | Fiebranz |
| 2005/0046342 | A1* | 3/2005 | Park et al. ...................... 313/504 |
| 2009/0174320 | A1* | 7/2009 | Kim ................................ 313/504 |
| 2009/0284144 | A1 | 11/2009 | Fujioka et al. |
| 2009/0322657 | A1* | 12/2009 | Na et al. ......................... 345/76 |
| 2011/0049493 | A1 | 3/2011 | Jun et al. |

FOREIGN PATENT DOCUMENTS

| JP | 2001-332388 | 11/2001 |
| KR | 10-2004-0051483 A | 6/2004 |
| KR | 10-2007-0117894 A | 12/2007 |
| KR | 10-2008-0003058 A | 1/2008 |

(Continued)

*Primary Examiner* — Yu Chen
(74) *Attorney, Agent, or Firm* — Christie, Parker & Hale, LLP

(57) ABSTRACT

An organic light emitting display device comprises a first substrate, an insulation layer having an inclined structure, a first electrode, a pixel defining layer defining a luminescent region and a non-luminescent region, an organic light emitting structure, a second electrode and a second substrate. Lateral portions of the first electrode, the second electrode and/or the pixel defining layer may have an inclination angle for preventing a total reflection of light generated from the organic light emitting structure, so that the organic light emitting display device may ensure a light efficiency substantially larger than that of the conventional organic light emitting display device by about at least 30 percent.

10 Claims, 12 Drawing Sheets

(56) References Cited

FOREIGN PATENT DOCUMENTS

| | | |
|---|---|---|
| KR | 10-2008-0087026 A | 9/2008 |
| KR | 10-2009-0119701 A | 11/2009 |
| KR | 10-2010-0054351 A | 5/2010 |
| KR | 10-2011-0021260 A | 3/2011 |

\* cited by examiner

METHODS OF FORMING INCLINED STRUCTURES ON INSULATION LAYERS, ORGANIC LIGHT EMITTING DISPLAY DEVICES AND METHODS OF MANUFACTURING ORGANIC LIGHT EMITTING DISPLAY DEVICES

CROSS REFERENCE TO RELATED APPLICATION

This application claims priority to and the benefit of Korean patent Application No. 10-2011-0063558, filed on Jun. 29, 2011, and Korean patent Application No. 10-2012-0059068, filed on, Jun. 1, 2012, the disclosures of which are hereby incorporated by references herein in their entirety.

BACKGROUND

1. Technical Field

Example embodiments of the invention relate to methods of forming inclined structures on insulation layers, organic light emitting display devices and methods of manufacturing organic light emitting display devices. More particularly, example embodiments of the invention relate to methods of forming inclined structures having desired inclination angles on insulation layers, organic light emitting display devices including the insulation layers having the inclined structures, and methods of manufacturing organic light emitting display devices including the insulation layers having the inclined structures.

2. Description of the Related Art

In flat panel display devices, an organic light emitting display (OLED) device may have various desired characteristics such as a high response speed, a lower power consumption and a wide viewing angle even though the organic light emitting display device has a relatively small size. Further, the organic light emitting display device may be manufactured at a relatively low temperature with a simple configuration, so the organic light emitting display device may be noticed as a next generation display device.

The conventional organic light emitting display device may have a configuration in which an anode and a cathode may be successively disposed on an insulation layer covering a thin film transistor (TFT) provided on a substrate, and an organic light emitting layer may be disposed between the anode and the cathode. However, in the conventional organic light emitting display device, a light generated from the organic light emitting layer may be totally reflected between the two electrodes, such that the light efficiency of the conventional organic light emitting display device may be considerably reduced. For example, the conventional organic light emitting display device may have an optical loss of about 30 percent because of the reflection of light among the anode, the organic light emitting layer and the cathode. Considering the optical loss of light, there is proposed an organic light emitting display device including organic light emitting layers having different thicknesses in a red pixel, a green pixel and a blue pixel so as to cause constructive interferences of a red color of light, a green color of light and a blue color of light. The organic light emitting display device including an optical resonance structure may have an increased light efficiency, however, such an organic light emitting display device may have a poor side visibility because of a color shift phenomenon caused by the optical resonance of light.

SUMMARY

Aspects of embodiments are directed toward methods of forming inclined structures having desired inclination angles on insulation layers.

Aspects of embodiments are directed toward organic light emitting display devices including insulation layers having inclined structures of desired inclination angles to enhance light efficiencies thereof.

Aspects of embodiments are directed toward methods of manufacturing organic light emitting display devices having improved light efficiencies using methods of forming inclined structures having desired inclination angles on insulation layers.

According to example embodiments, there is provided a method of forming an inclined structure of an insulation layer. In the method of forming an inclined structure on an insulation layer, a first recess may be formed on a first insulation film. A second insulation film may be formed on the first insulation film having the first recess, and a second recess may be formed on the second insulation film. The inclined structure may be formed from the first and the second recesses by performing a reflow process on the first and the second insulation films.

In example embodiments, each of the first and the second insulation films may include an organic material, a silicon compound, metal and/or metal oxide. For example, each of the first and the second insulation films may include photoresist, acryl-based polymer, polyimide-based polymer, polyamide-based polymer, siloxane-based polymer, polymer containing photosensitive acryl carboxyl group, novolak resin, alkali-soluble resin, silicon oxide, silicon nitride, silicon oxynitride, silicon oxycarbide, silicon carbon nitride, aluminum, magnesium, zinc, hafnium, zirconium, titanium, tantalum, aluminum oxide, titanium oxide, tantalum oxide, magnesium oxide, zinc oxide, hafnium oxide, zirconium oxide, etc. These may be used alone or in a combination thereof.

In example embodiments, each of the first and the second recesses may be formed using a mask including a light blocking region and a semi-transmissive region.

In example embodiments, the first recess may have a depth substantially larger than a depth of the second recess, and the second recess may have a width substantially larger than a width of the first recess.

In example embodiments, a surface treatment process may be additionally performed on a sidewall and a bottom of the first recess after forming the first recess.

In example embodiments, the reflow process may be performed at a temperature in a range of about 50% to about 80% of melting points of the first and the second insulation films.

In example embodiments, the inclined structure may have a substantially recessed shape or a substantially protruding shape. For example, a ratio between an inclination angle of a sidewall of the inclined structure and inclination angles of sidewalls of the first and the second recesses may be in a range of about 1.0:0.2 to about 1.0:1.8.

According to example embodiments, there is provided an organic light emitting display device including a first substrate, an insulation layer, a first electrode, a pixel defining layer, an organic light emitting structure, a second electrode and a second substrate. The insulation layer may be disposed on the first substrate. The insulation layer may include an inclined structure. The first electrode may be disposed on the insulation layer. The pixel defining layer may be disposed on the insulation layer and the first electrode. The pixel defining layer may define a luminescent region and a non-luminescent region. The organic light emitting structure may be disposed on the first electrode in the luminescent region. The second electrode may be disposed on the pixel defining layer and the organic light emitting structure. The second substrate may be disposed on the second electrode.

In example embodiments, the pixel defining layer may extend on the first electrode positioned on a sidewall of the inclined structure.

In some example embodiments, the pixel defining layer may extend on the first electrode positioned on an upper face of the inclined structure, and the pixel defining layer may have an opening exposing the first electrode in the luminescent region. The organic light emitting structure may be buried in the opening of the pixel defining layer. A sidewall of the organic light emitting structure may have an inclination angle of about 110° to about 160° relative to a direction substantially parallel to the first substrate.

In example embodiments, a sidewall of the inclined structure may have an inclination angle of about 20° to about 70° relative to a direction substantially parallel to the first substrate. Each of lateral portions of the first and the second electrodes on the inclined structure may have an inclination angle substantially the same as an inclination angle of a sidewall of the inclined structure.

In example embodiments, the insulation layer may have a plurality of protrusions formed on the inclined structure. The first electrode may have a plurality of protruding portions formed on the plurality of protrusions, respectively. The organic light emitting structure may have a plurality of portions divided by the protruding portions of the first electrode.

In example embodiments, the inclined structure may have a substantially recessed shape, and a sidewall of the inclined structure may have an inclination angle substantially the same as an inclination angle of a sidewall of the organic light emitting structure.

In example embodiments, the inclined structure may have a substantially protruding shape, and a ratio between an inclination angle of a sidewall of the inclined structure and an inclination angle of a sidewall of the organic light emitting structure may be in a range of about 1.0:0.2 to about 1.0:1.8 or about 1.0:1.6 to about 1.0:8.0.

According to example embodiments, there is provided a method of manufacturing an organic light emitting display device. In the method of manufacturing the organic light emitting display device, an insulation layer may be formed on a first substrate. An inclined structure may be formed on the insulation layer. A first electrode may be formed on the insulation layer. A pixel defining layer may be formed on the insulation layer and the first electrode. An opening exposing the first electrode positioned on the inclined structure may be formed by partially etching the pixel defining layer. An organic light emitting structure may be formed on the exposed first electrode. A second electrode may be formed on the pixel defining layer and the organic light emitting structure. A second substrate may be formed on the second electrode.

In forming of the insulation layer and the inclined structure according to example embodiments, a first insulation film may be formed on the first substrate. A first recess may be formed on the first insulation film. A second insulation film may be formed on the first insulation film having the first recess. A second recess may be formed on the second insulation film. The inclined structure may be formed from the first and the second recesses by reflowing the first and the second insulation films.

In forming of the insulation layer and the inclined structure according to example embodiments, a first insulation film may be formed on the first substrate. First recesses may be formed on the first insulation film. The first recesses may be separated from each other. A second insulation film may be formed on the first insulation film having the first recesses. Second recesses may be formed on portions of the second insulation film over the first recesses. The inclined structure having a protruding shape between adjacent recesses may be formed by reflowing the first and the second insulation films.

A plurality of protrusions may be formed on a bottom of the inclined structure. A plurality of protruding portions of the first electrode may be formed by the plurality of protrusions. Portions of the organic light emitting structure may be divided by the plurality of protruding portions of the first electrode.

According to example embodiments, the inclined structure having the protruding shape or the recessed shape may provide the lateral portions of the first electrode, the pixel defining layer and the second electrode having desired inclination angles for preventing a total reflection of light generated from the organic light emitting structure. Hence, the organic light emitting display device including the inclined structure may have a light efficiency substantially larger than that of the conventional organic light emitting display device by about more than 30 percent. Further, the organic light emitting display device does not require any additional structure for the optical resonance of the light generated from the organic light emitting structure, so that the organic light emitting display device may have a simplified configuration while displaying an image with an improved luminance, an enhanced contrast, an increased viewing angle, etc.

BRIEF DESCRIPTION OF THE DRAWINGS

Example embodiments may be understood in more detail from the following description taken in conjunction with the accompanying drawings, in which.

DESCRIPTION OF EMBODIMENTS

Figure 1:
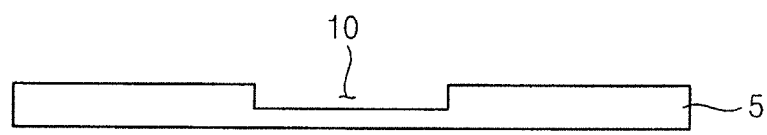
FIGS. 1 to 4 are cross-sectional views illustrating a method of forming an inclined structure on an insulation layer according to example embodiments.

The example embodiments are described more fully hereinafter with reference to the accompanying drawings. The inventive concept may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross sectional illustrations that are schematic illustrations of illustratively idealized example embodiments (and intermediate structures) of the inventive concept. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1 to 4 are cross-sectional views illustrating a method of forming an inclined structure on an insulation layer according to example embodiments.

Referring to FIG. 1, a first insulation film 5 may be formed on an object (not illustrated). The object may include a substrate, an insulation layer, a conductive layer, etc. Additionally, the object may include an underlying structure having a switching element, a contact, a pad, a plug, an electrode, a conductive pattern, an insulation pattern, etc. The first insulation film 5 may have a thickness sufficiently covering the underlying structure.

In some example embodiments, a planarization process may be performed on the object having the first insulation film 5 to improve a flatness of the first insulation film 5. For example, a chemical mechanical polishing (CMP) process and/or an etch back process may be executed on the first insulation film 5, so that the first insulation film 5 may have a substantially level surface.

In example embodiments, the first insulation film 5 may include an organic material. For example, the first insulation film 5 may be formed using photoresist, acryl-based polymer, polyimide-based polymer, polyamide-based polymer, siloxane-based polymer, polymer containing photosensitive acryl carboxyl group, novolak resin, alkali-soluble resin, etc. These may be used alone or in a combination thereof. In some example embodiments, the first insulation film 5 may be formed using an inorganic material such as a silicon compound, metal, metal oxide, etc. For example, the first insulation film 5 may include silicon oxide (SiOx), silicon nitride (SiNx), silicon oxynitride (SiOxNy), silicon oxycarbide (SiOxCy), silicon carbon nitride (SiCxNy), aluminum (Al), magnesium (Mg), zinc (Zn), hafnium (Hf), zirconium (Zr), titanium (Ti), tantalum (Ta), aluminum oxide (AlOx), titanium oxide (TiOx), magnesium oxide (MgOx), zinc oxide (ZnOx), hafnium oxide (HfOx), tantalum oxide (TaOx), zirconium oxide (ZrOx), etc. These may be used alone or in a combination thereof. The first insulation film 5 may be formed by a spin coating process, a printing process, a sputtering process, a chemical vapor deposition (CVD) process, an atomic layer deposition (ALD) process, a plasma enhanced chemical vapor deposition (PECVD) process, a high density plasma-chemical vapor deposition (HDP-CVD) process, a vacuum evaporation process, etc. The process for forming the first insulation film 5 may be selected in accordance with the material included in the first insulation film 5.

Referring still to FIG. 1, a first mask (not illustrated) may be placed over the first insulation film 5. The first mask may include a light blocking region and a semi-transmissive region. A first exposure process may be performed on the first insulation film 5 using the first mask. For example, the first insulation film 5 may be exposed to ultraviolet ray or laser in the first exposure process. Alternatively, a first etching process may be executed on the first insulation film 5 using an additional etching mask. The first exposure process and the first etching process may be selectively carried out in accordance with the material included in the first insulation film 5. In example embodiments, the first mask may include a half tone mask, a half tone slit mask, etc. The first mask may additionally include a transmissive region adjacent to the light blocking region and/or the semi-transmissive region.

When the first insulation film 5 undergoes the first exposure process, a first developing process or the first etching process may be performed on the first insulation film 5 to partially remove the exposed first insulation film 5. Thus, a first recess 10 may be formed on the first insulation film 5. In example embodiments, the first recess 10 may have a relatively large first depth measured from an upper face of the first insulation film 5. Additionally, the first recess 10 may have a relatively small first width. A sidewall of the first recess 10 may have a relatively large first inclination angle relative to a direction substantially parallel to the object (or, e.g., to an upper surface of the first film 5). For example, the first angle of the sidewall of the first recess 10 may be in a range of about 40° to about 90° with respect to an axis substantially parallel to an upper face of the object.

Figure 2:
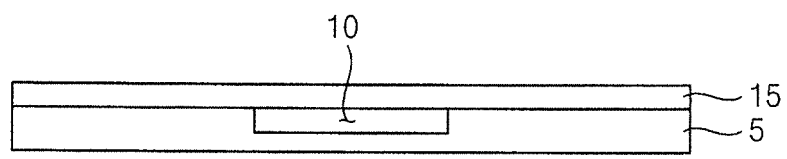

Referring to FIG. 2, a second insulation film 15 may be formed on the first insulation film 5 having the first recess 10 thereon. The second insulation film 15 may be formed using an organic material or an inorganic material. For example, the second insulation film 15 may include acryl-based polymer, polyimide-based polymer, polyamide-based polymer, siloxane-based polymer, polymer containing photosensitive acryl carboxyl group, novolak resin, alkali-soluble resin, silicon oxide, silicon nitride, silicon oxynitride, silicon oxycarbide, silicon carbon nitride, aluminum, magnesium, zinc, hafnium, zirconium, titanium, tantalum, aluminum oxide, titanium oxide, magnesium oxide, zinc oxide, hafnium oxide, tantalum oxide, zirconium oxide, etc. These may be used alone or in a combination thereof. The second insulation film 15 may be formed by spin coating process, a printing process, a sputtering process, a chemical vapor deposition process, an atomic layer deposition process, a plasma enhanced chemical vapor deposition process, a high density plasma-chemical vapor deposition process, a vacuum evaporation process, etc. The process for forming the second insulation film 15 may also be selected in accordance with the material included in the second insulation film 15. In example embodiments, the second insulation film 15 may include a material substantially the same as or substantially similar to that of the first insulation film 5. Alternatively, the first and the second insulation films 5 and 15 may be formed using different materials, respectively.

In example embodiments, the second insulation film 15 may be provided on the first insulation film 5 without filling the first recess 10. That is, the first recess 10 may be interposed between the first insulation film 5 and the second insulation film 15 since the first recess 10 may not be filled with the second insulation film 15. To accomplish such a configuration including the first and the second insulation films 5 and 15, a surface treatment process may be performed on the first recess 10. For example, the surface treatment process may be selectively executed on a bottom and a sidewall of the first recess 10. The surface treatment process may include a plasma treatment process, a hydrophobic treatment process, etc.

Figure 3:
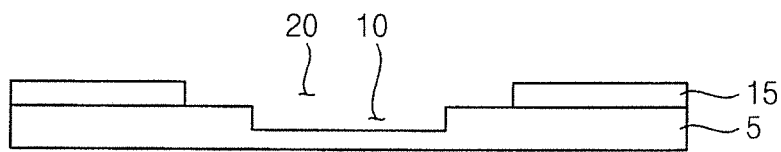

Referring to FIG. 3, a second exposure process may be performed on the second insulation film 15 after placing a second mask (not illustrated) over the second insulation film 15. The second mask may include a light blocking region and a semi-transmissive region. The second exposure process may be also carried out using ultraviolet ray or laser. The second mask may also include a half tone mask or a half tone slit mask. Additionally, the second mask may include a transmissive region adjacent to the light blocking region and/or the semi-transmissive region.

A second developing process or a second etching process may be performed on the exposed second insulation film 15, so that a second recess 20 may be formed on the second insulation film 15. The second developing process and the second etching process may be selectively executed on the second insulation film 15 in accordance with the material included in the second insulation film 15.

In example embodiments, the second recess 20 may be communicated with the first recess 10. The second recess 20 may have a relatively large second width and a relatively small second depth. That is, the second width of the second recess 20 may be substantially larger than the first width of the first recess 10 whereas the second depth of the second recess 20 may be substantially smaller than the first depth of the first recess 10. Additionally, the second recess 20 may include a sidewall having a relatively large second inclination angle relative to the axis substantially parallel to the object. For example, the second inclination angle of the sidewall of the second recess 20 may be in a range of about 40° to about 90° with respect to the direction substantially parallel to the upper face of the object (or, e.g., to the upper face of the second insulation film 15). That is, the second inclination angle of the second recess 20 may be substantially the same as or substantially similar to the first inclination angle of the first recess 10. When the first and the second recesses 10 and 20 are formed on the first and the second insulation films 5 and 15, a stepped portion may be provided between the first insulation film 5 and the second insulation film 15.

Figure 4:
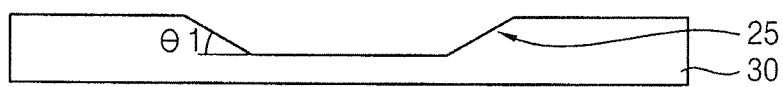

Referring to FIG. 4, a reflow process may be performed on the first and the second insulation films 5 and 15 to form an inclined structure 25 from the first and the second recesses 10 and 20. In example embodiments, the reflow process may be carried out at a temperature of about 50% to about 80% of melting points (Tm) of the first and the second insulation films 5 and 15. For example, the inclined structure 25 may be obtained by the reflow process executed at a temperature of about 100° C. to about 300° C. for about 30 minutes to about 2 hours in accordance with ingredients included in the first and the second insulation films 5 and 15. The inclined structure 25 may include a sidewall having a desired inclination angle by adjusting a process time and a process temperature considering the ingredients in the first and the second insulation films 5 and 15.

In the reflow process according to example embodiments, the first and the second insulation films 5 and 15 may be integrally combined to provide an insulation layer 30 having the inclined structure 25. That is, the first and the second recesses 10 and 20 may be changed into the inclined structure 25 in the reflow process such that the insulation layer 30 including the inclined structure 25 may be formed on the object.

The inclined structure 25 may have a relatively large third depth, and the sidewall of the inclined structure 25 may have a relatively small third inclination angle $\theta 1$. Namely, the third depth of the inclined structure 25 may be substantially larger than the first depth of the first recess 10. For example, the third depth of the inclined structure 25 may be substantially the same as or substantially similar to a sum of the first depth of the first recess 10 and the second depth of the second recess 20. In addition, the third inclination angle $\theta 1$ of the inclined structure 25 may be substantially smaller than the first inclination angle of the first recess 10 or the second inclination angle of the second recess 20.

When the inclined structure 25 includes the sidewall having the third inclination angle $\theta 1$, the inclined structure 25 may have an upper width substantially larger than a lower width thereof. For example, the third inclination angle $\theta 1$ of the inclined structure 25 may be in a range of about 20° to about 70° relative to the direction substantially parallel to the upper surface of the object (or, e.g., to the upper surface of the second insulation film 15 and the first insulation film 5). Hence, a ratio between the first inclination angle of the first recess 10 and the third inclination angle $\theta 1$ of the inclined structure 25 may be in a range of about 1.0:0.2 to about 1.0:1.8. Additionally, a ratio between the second inclination angle of the second recess 20 and the third inclination angle $\theta 1$ of the inclined structure 25 may also be in a range of about 1.0:0.2 to about 1.0:1.8. The third inclination angle $\theta 1$ of the inclined structure 25 may vary in accordance with the process conditions of the reflow process such as the process time, the process temperature, etc. That is, the process conditions of the reflow process may be adjusted to provide the third inclined structure 25 including the sidewall having the desired third inclination angle θ1 considering the structures (e.g., emission directions) of the organic light emitting display devices.

When a light may be incident onto the insulation layer 30 having the inclined structure 25, the incident light may be reflected on the sidewall of the inclined structure 25. In this case, the light, which is generated from a light emitting structure (not illustrated) including a plurality of layers positioned in the inclined structure 25, may not be totally reflected among the plurality of layers of the light emitting structure and/or an upper reflective layer or a lower reflective layer. That is, the inclined structure 25 having the third inclination angle θ1 may prevent the total reflection of the light generated from the light emitting structure. Therefore, the efficiency of the light generated from the organic light emitting structure may be improved because of the inclined structure 25 having the third inclination angle θ1 where the light emitting structure is located.

As described above, the insulation layer 30 may have the inclined structure 25 having a recessed shape. In some example embodiments, an inclined structure having a protruding shape may be formed on the insulation layer 30. In other words, the inclined structure having the protruding shape may be obtained by processes substantially similar to the processes described with reference to FIG. 1 to FIG. 4. When two or more inclined structures having recessed shapes are formed on the insulation layer 30 by a set or predetermined distance apart, the inclined structure having the protruding shape may be provided between adjacent recessed inclined structures. Thus, the insulation layer 30 may have the protruding inclined structure and the recessed inclined structures or may have the protruding inclined structure only by removing the recessed inclined structures. According to some example embodiments, the first insulation film 5 may be formed on the object, and then first recesses may be formed on the first insulation film 5 by a set or predetermined distance. The second insulation film 15 may be formed on the first insulation film 5 by interposing the first recesses therebetween, and then second recesses may be formed on portions of the second insulation film 15 overlying the first recesses. When the first and the second insulation films 5 and 15 are reflowed, the inclined structure having the protruding shape may be provided between adjacent recesses provided by the combinations of the first and the second recesses. Here, a sidewall of the protruding inclined structure may have an inclination angle substantially the same as or substantially similar to the inclination angle of the sidewall of the recessed inclined structure. Namely, adjacent protruding inclined structure and recessed inclined structure may have one common sidewall.

FIGS. 5 to 11 are cross-sectional views illustrating a method of manufacturing an organic light emitting display device in accordance with example embodiments.

Figure 5:
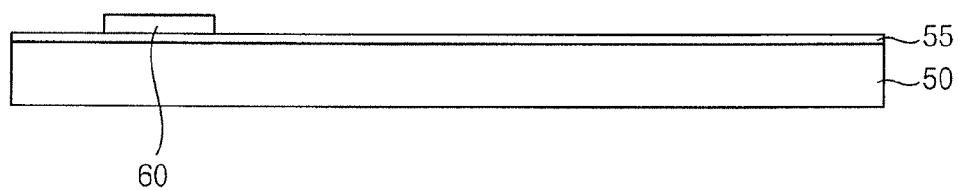
FIGS. 5 to 11 are cross-sectional views illustrating a method of manufacturing an organic light emitting display device in accordance with example embodiments.

Referring to FIG. 5, a buffer layer 55 may be provided on a first substrate 50. The first substrate 50 may include a transparent insulation substrate. For example, the first substrate 50 may include a glass substrate, a quartz substrate, a transparent resin substrate, etc. Examples of the transparent resin substrate for the first substrate 50 may include polyimide resin, acrylic resin, polyacrylate resin, polycarbonate resin, polyether resin, polyethyleneterephthalate resin, sulfonic acid resin, etc.

In some example embodiments, a planarization process may be performed on the first substrate 50 before forming the buffer layer 55 on the first substrate 50. For example, a chemical mechanical polishing (CMP) process and/or an etch-back process may be executed on the first substrate 50 such that the first substrate 50 may have a substantially level surface. In some example embodiments, the buffer layer 55 may not be formed on the first substrate 50 in accordance with the flatness of the first substrate 50, the ingredients included in the first substrate 50, etc.

The buffer layer 55 may prevent the diffusion of metal atoms, metal ions and/or impurities from the first substrate 50 in successive processes. The buffer layer 55 may also control a heat transferring rate in a successive crystallization process for a semiconductor pattern 60, so that the semiconductor pattern 60 may be uniformly formed on the buffer layer 55. Further, the buffer layer 55 may improve the flatness of the first substrate 50 when the first substrate 50 has a substantially irregular surface. The buffer layer 55 may be formed using a silicon compound. For example, the buffer layer 55 may include silicon oxide (SiOx), silicon nitride (SiNx), silicon oxynitride (SiOxNy), silicon oxycarbide (SiOxCy), silicon carbon nitride (SiCxNy), etc. These may be used alone or in a combination thereof. In some example embodiments, the buffer layer 55 may have a single layer structure or a multi layer structure. For example, the buffer layer 55 may include a silicon oxide film, a silicon nitride film, a silicon oxynitride film, a silicon oxycarbide film and/or a silicon carbon nitride film.

The semiconductor pattern 60 may be formed on the buffer layer 55. In example embodiments, a semiconductor layer (not illustrated) may be formed on the buffer layer 55, and then the semiconductor layer may be patterned to form a preliminary semiconductor pattern (not illustrated) on a portion of the buffer layer 55. The preliminary semiconductor pattern may be crystallized to provide the semiconductor pattern 60 on the portion of the buffer layer 55. The semiconductor layer may be formed by a chemical vapor deposition process, a plasma enhanced chemical vapor deposition process, a low pressure chemical vapor deposition process, a sputtering process, etc. When the semiconductor layer includes amorphous silicon, the semiconductor pattern 60 may include polysilicon. Here, the crystallization process for forming the semiconductor pattern 60 may include a laser irradiation process, a thermal treatment process, a thermal process using a catalyst, etc.

In some example embodiments, a dehydrogenation process may be performed on the semiconductor layer and/or the preliminary semiconductor layer after forming the semiconductor layer and/or the preliminary semiconductor layer. The dehydrogenation process may reduce the hydrogen concentration in the semiconductor layer and/or the preliminary semiconductor layer, such that the semiconductor pattern 60 may ensure enhanced electrical characteristics.

Figure 6:
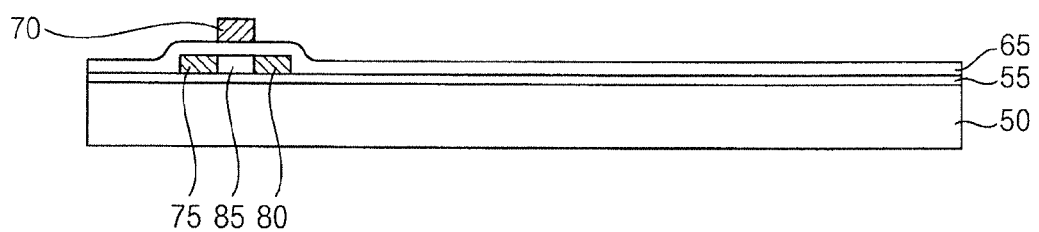

Referring to FIG. 6, a gate insulation layer 65 may be formed on the buffer layer 55 to cover the semiconductor pattern 60. The gate insulation layer 65 may be obtained by a chemical vapor deposition process, a spin coating process, a plasma enhanced chemical vapor deposition process, a high density plasma-chemical vapor deposition process, a printing process, etc. The gate insulation layer 65 may include silicon oxide, metal oxide, etc. Example of the metal oxide for the gate insulation layer 65 may include hafnium oxide (HfOx), aluminum oxide (AlOx), zirconium oxide (ZrOx), titanium oxide (TiOx), tantalum oxide (TaOx), etc. These may be used alone or in a combination thereof.

The gate insulation layer 65 may be substantially uniformly formed on the buffer layer 55 along a profile of the semiconductor pattern 60. The gate insulation layer 65 may have a relatively small thickness, and the gate insulation layer 65 may have a stepped portion adjacent to the semiconductor pattern 60. In some example embodiments, the gate insulation layer 65 may have a substantially level surface while sufficiently covering the semiconductor pattern 60. In this case, the gate insulation layer 65 may have a relatively large thickness.

A gate electrode 70 may be formed on the gate insulation layer 65. The gate electrode 70 may be disposed on a portion of the gate insulation layer 65 under which the semiconductor pattern 60 is located. In example embodiments, a first conductive layer (not illustrated) may be formed on the gate insulation layer 65, the first conductive layer may be patterned by a photolithography process or an etching process using an additional etching mask. Thus, the gate electrode 70 may be provided on the gate insulation layer 65. The first conductive layer may be formed using a sputtering process, a chemical vapor deposition process, a pulsed laser deposition process, a vacuum evaporation process, an atomic layer deposition process, a printing process, etc.

The gate electrode 70 may include metal, alloy, metal nitride, conductive metal oxide, a transparent conductive material, etc. For example, the gate electrode 70 may be formed using aluminum (Al), alloy containing aluminum, aluminum nitride (AlNx), silver (Ag), alloy containing silver, tungsten (W), tungsten nitride (WNx), copper (Cu), alloy containing copper, nickel (Ni), chrome (Cr), chrome nitride (CrNx), molybdenum (Mo), alloy containing molybdenum, titanium (Ti), titanium nitride (TiNx), platinum (Pt), tantalum (Ta), zinc oxide (ZnOx), indium tin oxide (ITO), tin oxide (SnOx), indium oxide (InOx), gallium oxide (GaOx), indium zinc oxide (IZO), etc. These may be used alone or in a combination thereof. In example embodiments, the gate electrode 70 may have a single layer structure that includes the above-mentioned metal, alloy, metal nitride, conductive metal oxide or the transparent conductive material. In some example embodiments, the gate electrode 70 may have a multi layer structure that includes the above-mentioned metal, alloy, metal nitride, conductive metal oxide and/or the transparent conductive material.

Although not illustrated in FIG. 6, a gate line may be formed on a portion of the gate insulation layer 65 while forming the gate electrode 70. The gate electrode 70 may make electrical contact with the gate line, and the gate line may extend on the gate insulation layer 65 along a first direction.

Using the gate electrode 70 as an implantation mask, impurities may be implanted into the semiconductor pattern 60, so that a source region 75 and a drain region 80 may be created in the semiconductor pattern 60. The impurities passing through the gate electrode 70 may be injected into lateral portions of the semiconductor pattern 60 by controlling ion implantation energy of the ion implantation process. Here, a central portion of the semiconductor pattern 60 beneath the gate electrode 70 does not have implanted impurities, such that the central portion of the semiconductor pattern 60 may serve an a channel region 85 between the source region 75 and the drain region 80. In other words, the channel region 85 may be defined in accordance with the formation of the source and the drain regions 75 and 80. In some example embodiments, a mask (not illustrated) may be provided on a portion of the gate insulation layer 65 adjacent to the gate electrode 70, and then the source and the drain regions 75 and 80 may be formed simultaneously using the mask and the gate electrode 70 as implantation masks.

In example embodiments, the gate electrode 70 may have a width substantially smaller than that of the semiconductor pattern 60. For example, the gate electrode 70 may have a width substantially the same as or substantially similar to a width of the channel region 85. However, dimensions of the gate electrode 70 and/or dimensions of the channel region 85 may vary in accordance with required electrical characteristics of a switching device.

Figure 7:
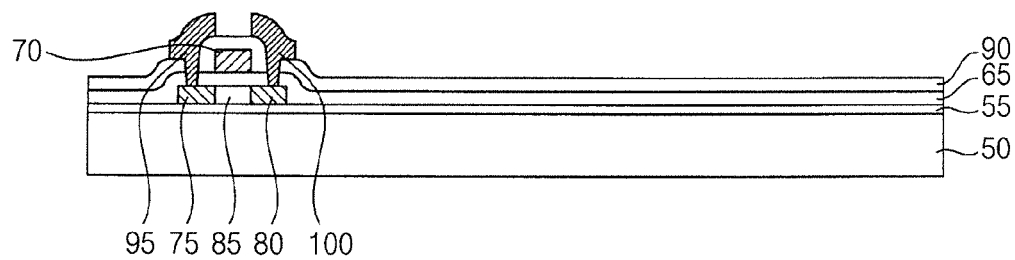

Referring to FIG. 7, an insulation interlayer 90 may be formed on the gate insulation layer 65 to cover the gate electrode 70. The insulation interlayer 90 may be substantially uniformly formed on the gate insulation layer 65 along a profile of the gate electrode 70. Hence, the insulation interlayer 90 may have a stepped portion adjacent to the gate electrode 70. The insulation interlayer 90 may include a silicon compound. For example, the insulation interlayer 90 may be formed using silicon oxide, silicon nitride, silicon oxynitride, silicon oxycarbide, silicon carbon nitride, etc. These may be used alone or in a mixture thereof. The insulation interlayer 90 may have a single layer structure or a multi layer structure, which include a silicon oxide film, a silicon nitride film, a silicon oxynitride film, a silicon oxycarbide film and/or a silicon carbon nitride film. Here, the insulation interlayer 90 may be obtained by a spin coating process, a chemical vapor deposition process, a plasma enhanced chemical vapor deposition process, a high density plasma-chemical vapor deposition process, etc. The insulation interlayer 90 may electrically insulate the gate electrode 70 from a source electrode 95 and a drain electrode 100, which are successively formed.

The source electrode 95 and the drain electrode 100 may be formed on the insulation interlayer 90. The source and the drain electrodes 95 and 100 may be disposed with the gate electrode 70 as the center by a set or predetermined distance apart. Each of the source and the drain electrodes 95 and 100 may be adjacent to the gate electrode 70. For example, the source and the drain electrodes 95 and 100 may extend from portions of the insulation interlayer 90 over the source and the drain regions 75 and 80 onto portions of the insulation interlayer 90 over the gate electrode 70, respectively. Further, the source and the drain electrodes 95 and 100 may pass through the insulation interlayer 90 to make electrical contact with the source and the drain regions 75 and 80, respectively.

In example embodiments, the insulation interlayer 90 may be partially etched to form holes (not illustrated) for exposing the source region 75 and the drain region 80, respectively. A second conductive layer (not illustrated) may be formed on the insulation interlayer 90 to fill up the holes. By patterning the second conductive layer, the source electrode 95 and the drain electrode 100 may be formed on the source region 75 and the drain region 80 as illustrated in FIG. 7. The second conductive layer may be formed by a sputtering process, a chemical vapor deposition process, a pulsed laser deposition process, a vacuum evaporation process, an atomic layer deposition process, a printing process, etc. Each of the source and the drain electrodes 95 and 100 may include metal, alloy, metal nitride, conductive metal oxide, a transparent conductive material, etc. For example, each of the source and the drain electrodes 95 and 100 may be formed using aluminum, alloy containing aluminum, aluminum nitride, silver, alloy containing silver, tungsten, tungsten nitride, copper, alloy containing copper, nickel, chrome, chrome nitride, molybdenum, alloy containing molybdenum, titanium, titanium nitride, platinum, tantalum, tantalum nitride, neodymium (Nd), scandium (Sc), strontium ruthenium oxide, zinc oxide, indium tin oxide, tin oxide, indium oxide, gallium oxide, indium zinc oxide, etc. These may be used alone or in a combination thereof. Further, each of the source and the drain electrodes 95 and 100 may have a single layer structure or a multi layer structure, which may include a metal film, an alloy film, a metal nitride film, a conductive metal oxide film and/or a transparent conductive material film.

Although it is not illustrated, a data line extending along a second direction may be formed on the insulation interlayer 90 while forming the source and the drain electrodes 95 and 100. Here, the second direction may be substantially perpendicular to the first direction where the gate line extends. The source electrode 95 may be electrically connected to the data line.

When the source and the drain electrodes 95 and 100 are formed on the insulation interlayer 90, the switching device of the organic light emitting display device may be provided on the first substrate 50. The switching device may be a thin film transistor that includes the semiconductor pattern 60, the gate insulation layer 65, the gate electrode 70, the source electrode 95 and the drain electrode 100.

Figure 8:
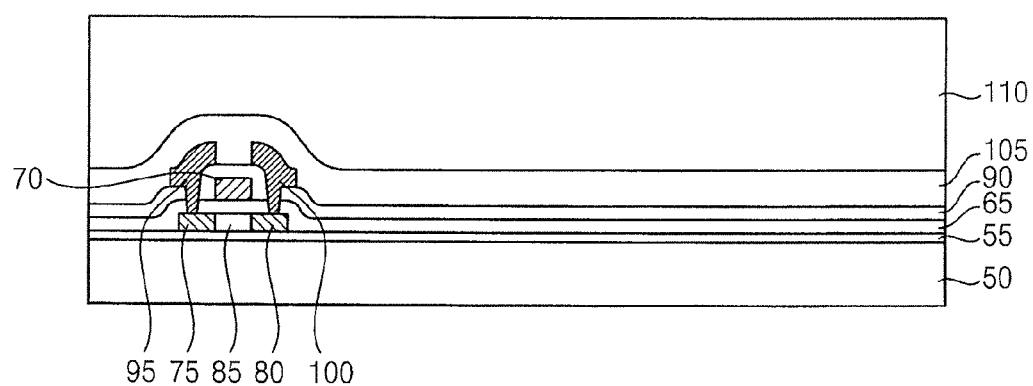

Referring to FIG. 8, a first protection layer 105 may be formed on the insulation interlayer 90 to cover the source and the drain electrodes 95 and 100. The first protection layer 105 may have a sufficient thickness that fully covers the source and the drain electrodes 95 and 100. The first protection layer 105 may include an organic material or an inorganic material. For example, the first protection layer 105 may be formed using photoresist, acryl-based polymer, polyimide-based polymer, polyamide-based polymer, siloxane-based polymer, polymer containing photosensitive acrylic carboxyl group, novolak resin, alkali soluble resin, silicon oxide, silicon nitride, silicon oxynitride, silicon oxycarbide, silicon carbon nitride, aluminum, magnesium, zinc, hafnium, zirconium, titanium, tantalum, aluminum oxide, titanium oxide, tantalum oxide, magnesium oxide, zinc oxide, hafnium oxide, zirconium oxide, titanium oxide, etc. These may be used alone or in a combination thereof. According to the ingredient in the first protection layer 105, the first protection layer 105 may be obtained by a spin coating process, a printing process, a sputtering process, a chemical vapor deposition process, an atomic layer deposition process, a plasma enhanced chemical vapor deposition process, a high density plasma-chemical vapor deposition process, a vacuum evaporation process, a printing process, etc. In some example embodiments, the first protection layer 105 covering the switching device may not be formed in accordance with ingredients and/or dimensions of an insulation layer 110 successively formed.

Figure 9:
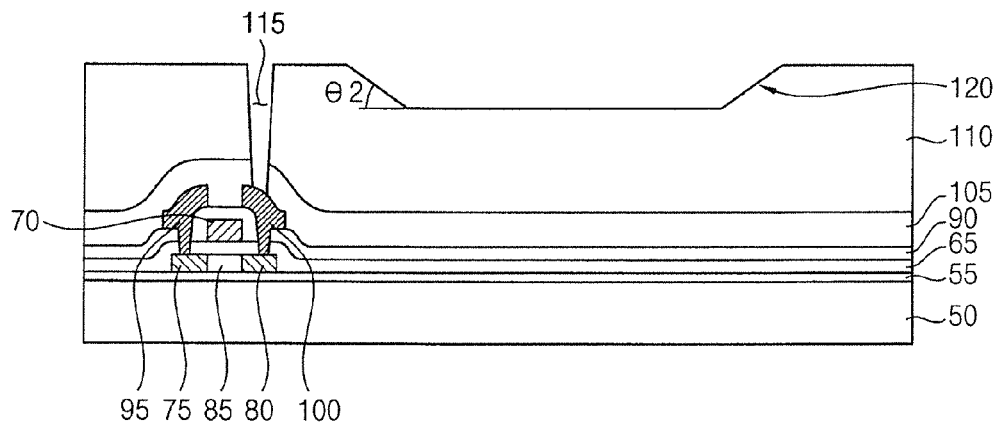

Referring to FIGS. 8 and 9, the insulation layer 110 having an inclined structure 120 may be formed on the first protection layer 105. The insulation layer 110 may have a single layer structure, or may have a multi layer structure including more than two insulation films. In example embodiments, the insulation layer 110 may include a first insulation film and a second insulation film successively formed on the first protection layer 105. The processes for forming the insulation layer 110 having the first and the second insulation films may be substantially the same as or substantially similar to the processes for forming the first and the second insulation films 5 and 15 described with reference to FIGS. 1 and 2. Additionally, the first and the second insulation films of the insulation layer 110 may include materials substantially the same as or substantially similar to those of the first and the second insulation films 5 and 15, respectively.

As illustrated in FIGS. 8 and 9, the inclined structure 120 having a fourth inclination angle θ2 may be provided on the insulation layer 110. That is, a sidewall of the inclined structure 120 may have the fourth inclination angle θ2. Additionally, a hole 115 may be formed through the insulation layer 110 and the first protection layer 105 to partially expose the drain electrode 100. In example embodiments, the hole 115 may be formed while forming the inclined structure 120 on the insulation layer 110. In some example embodiments, the hole 115 exposing a portion of the drain electrode 100 may be formed through the insulation layer 110 and the first protection layer 105 after forming the inclined structure 120 on the insulation layer 110.

The inclined structure 120 of the insulation layer 110 may be formed by processes substantially the same as or substantially similar to those for forming the inclined structure 25 of the insulation layer 30 described with reference to FIGS. 1 to 4. In addition, the fourth inclination angle θ2 of the sidewall of the inclined structure 120 may be substantially the same as or substantially similar to the third inclination angle θ1 of the sidewall of the above-described inclined structure 25. For example, the fourth inclination angle θ2 of the sidewall of the inclined structure 120 may be in a range of about 20° to about 70° relative to a direction substantially parallel to the first substrate 50.

As illustrated in FIG. 9, the inclined structure 120 having a recessed shape may be provided on the insulation layer 110. When the inclined structure 120 has such a recessed shape, the organic light emitting display device including the insulation layer 110 may have a top emission structure (or a top emission direction). In other words, the organic light emitting display device may have the top emission structure in case the insulation layer 110 includes the recessed inclined structure 120.

A first electrode 125 filling the hole 115 may be formed on the insulation layer 110 having the inclined structure 120. The first electrode 125 may make contact with the drain electrode 100, and may extend on the sidewall and a bottom of the inclined structure 120. Thus, a lateral portion of the first electrode 125 positioned in the inclined structure 120 may have an inclination angle substantially the same as or substantially similar to the fourth inclination angle θ2 of the inclined structure 120. For example, the lateral portion of the first electrode 125 in the inclined structure 120 may have an inclination angle in a range of about 20° to about 70° relative to an axis substantially parallel to the first substrate 50 (or, e.g., to an upper surface of the first substrate 50).

When the organic light emitting display device has the top emission structure, the first electrode 125 may include a reflective material. For example, the first electrode 125 may be formed using aluminum, silver, gold (Au), chrome, tungsten, molybdenum, titanium, palladium (Pa), iridium (Ir), allot thereof, etc. These may be used alone or in a combination thereof. Further, the first electrode 125 may have a single layer structure or a multi layer structure, which includes the above-mentioned metal and/or alloy.

In example embodiments, a first electrode layer (not illustrated) may be formed on the insulation layer 110 to fill up the hole 115 exposing the drain electrode 100, and then the first electrode layer may be patterned to provide the first electrode 125 on the insulation layer 110 having the inclined structure 120. Here, according to ingredients in the first electrode 125, the first electrode layer may be formed by a sputtering process, a vacuum evaporation process, a chemical vapor deposition process, a pulsed laser deposition process, a printing process, an atomic layer deposition process, etc. As described below, the first electrode 125 may extend from a luminescent region of the organic light emitting display device onto a portion of a non-luminescent region of the organic light emitting display device.

In some example embodiments, a contact structure (not illustrated) or a pad structure (not illustrated) may be formed on the exposed first electrode 125 in the hole 115 formed through the first protection layer 105 and the insulation layer 110, and then the first electrode 125 contacting the contact structure or the pad structure may be formed on the insulation layer 110. In this case, the first electrode 125 may be electrically connected to the drain electrode 100 through the contact structure or the pad structure.

Figure 10:
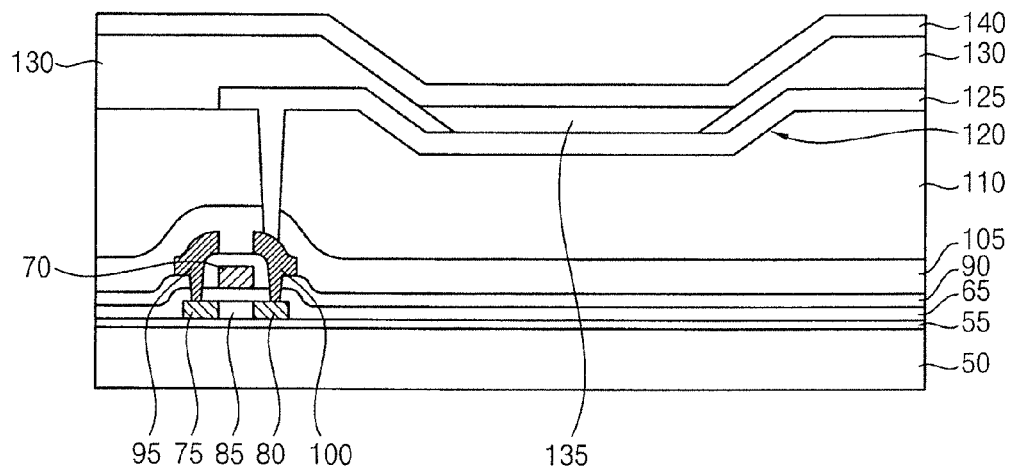

Referring now to FIG. 10, a pixel defining layer 130 may be formed on the insulation layer 110 and the first electrode 125. The pixel defining layer 130 may be formed using an organic material or an inorganic material. For example, the pixel defining layer 130 may be formed using photoresist, polyacryl-based resin, polyimide-based resin, acryl-based resin, a silicon compound, etc. These may be used alone or in a combination thereof.

The pixel defining layer 130 may be partially etched to form an opening at a portion of the first electrode 125. For example, the opening of the pixel defining layer 130 may be formed by a photolithography process or an etching process using an additional etching mask. In example embodiments, a sidewall of the opening of the pixel defining layer 130 may have an inclination angle substantially the same as or substantially similar to the fourth inclination angle θ2 of the inclined structure 120. For example, the sidewall of the opening of the pixel defining layer 130 may have an inclination angle in a range of about 20° to about 70° with respect to the direction substantially parallel to the first substrate 50.

When the opening is provided on the pixel defining layer 130, the luminescent and the non-luminescent regions of the organic light emitting display device may be defined. That is, a region including the opening of the pixel defining layer 130 may correspond to the luminescent region whereas a region adjacent to the opening of the pixel defining layer 130 may correspond to the non-luminescent region. The inclined structure 120 of the insulation layer 110 may be positioned in the luminescent region. In the luminescent region, the first electrode 125 may be substantially uniformly formed on the bottom and the sidewall of the inclined structure 120. The pixel defining layer 130 may extend to a portion of the luminescent region so that the pixel defining layer 130 may locate on the sidewall of the inclined structure 120 and a portion of a bottom of the inclined structure 120. In other words, the pixel defining layer 130 may cover the lateral portion of the first electrode 125 in the luminescent region. Therefore, a portion of the pixel defining layer 130 (i.e., the sidewall of the opening) in the luminescent region may have an inclination angle substantially the same as or substantially similar to the fourth inclination angle θ2 of the inclined structure 120. For example, the pixel defining layer 130 in the luminescent region may have an inclination angle in a range of about 20° to about 70° relative to the axis substantially parallel to the first substrate 50.

An organic light emitting structure 135 may be formed on the pixel defining layer 130 and the first electrode 125 in the luminescent region. In example embodiments, the organic light emitting structure 135 may have a multi layer structure that includes an organic light emitting layer (EL), a hole injection layer (HIL), a hole transfer layer (NTL), an electron transfer layer (ETL), an electron injection layer (EIL), etc. According to pixels of the organic light emitting display device, the organic light emitting structure 135 may include various light emitting materials for generating various colors of light such as a red color of light, a green color of light, a blue color of light, etc. In some example embodiments, the organic light emitting structure 135 may have a multi layer structure that includes stacked light emitting material films for generating a white color of light in which a red color of light, a green color of light and a blue color of light are mixed. In other example embodiments, the organic light emitting structure 135 may additionally include a host material having a band gap substantially larger than those of the light emitting materials.

In example embodiments, the organic light emitting structure 135 may be disposed on the inclined structure 120 in the luminescent region. Further, the organic light emitting structure 135 may make contact with the first electrode 125 and the pixel defining layer 130 in the luminescent region. Namely, a bottom of the organic light emitting structure 135 may be positioned on the first electrode 125 and a lateral portion of the organic light emitting structure 135 may be contacted with the pixel defining layer 130. Thus, the later portion of the organic light emitting structure 135 may have an inclination angle substantially the same as or substantially similar to the fourth inclination angle θ2 of the sidewall of the inclined structure 120. For example, the lateral portion of the organic light emitting structure 135 may have an inclination angle of about 20° to about 70° with respect to the axis substantially parallel to the first substrate 50.

A second electrode 140 may be formed on the organic light emitting structure 135 and the pixel defining layer 130. The second electrode 140 may be uniformly formed on the pixel defining layer 130 and the organic light emitting structure 135. When the organic light emitting display device has the top emission structure, the second electrode 140 may include a transparent conductive material. For example, the second electrode 140 may be formed using indium tin oxide, indium zinc oxide, zinc oxide, tin oxide, gallium oxide, etc. These may be used alone or in a mixture thereof.

In example embodiments, the second electrode 140 may extend from the luminescent region to the non-luminescent region. In some example embodiments, the second electrode 140 may be disposed in the luminescent region only. For example, the second electrode 140 may be formed on the organic light emitting structure 135 and a portion of the pixel defining layer 130 (e.g., the sidewall of the opening). Here, a second conductive layer (not illustrated) may be formed on the organic light emitting structure 135 and the pixel defining layer, and then the second conductive layer may be patterned to provide the second electrode 140 in the luminescent region.

According to the fourth inclination angle θ2 of the sidewall of the inclined structure 120, the second electrode 140 may have an inclination angle substantially the same as or substantially similar to fourth inclination angle θ2. For example, a later portion of the second electrode 140 on the pixel defining layer 130 in the luminescent region may have an inclination angle in a range of about 20° to about 70° relative to the axis substantially parallel to the first substrate 50.

As for the conventional organic light emitting display device having a lower electrode, an organic light emitting layer and an upper electrode, a light generated from the organic light emitting layer may be totally reflected between the lower end the upper electrodes. Hence, the conventional organic light emitting display device may have a loss of light by about 30 percent because of the total reflection of the light. However, the organic light emitting display device according to example embodiments may include the inclined structure 120 having the recessed shape, such that the lateral portions of the first electrodes 125, the organic light emitting structure 135 and the second electrode 140 may have the inclination angles for preventing a total reflection of light generated from the organic light emitting structure 135. Therefore, the organic light emitting display device according to example embodiments may ensure a greatly improved light efficiency substantially larger than that of the conventional organic light emitting display device by at least about 30 percent. Additionally, the organic light emitting display device according to example embodiments may not require a relatively complicated configuration for an optical resonance of the light generated from the organic light emitting structure 135, so that the organic light emitting display device may have a configuration substantially simpler than that of the conventional organic light emitting display device. Furthermore, the organic light emitting display device according to example embodiments may ensure an enhanced viewing angle because of the simplified configuration.

Figure 11:
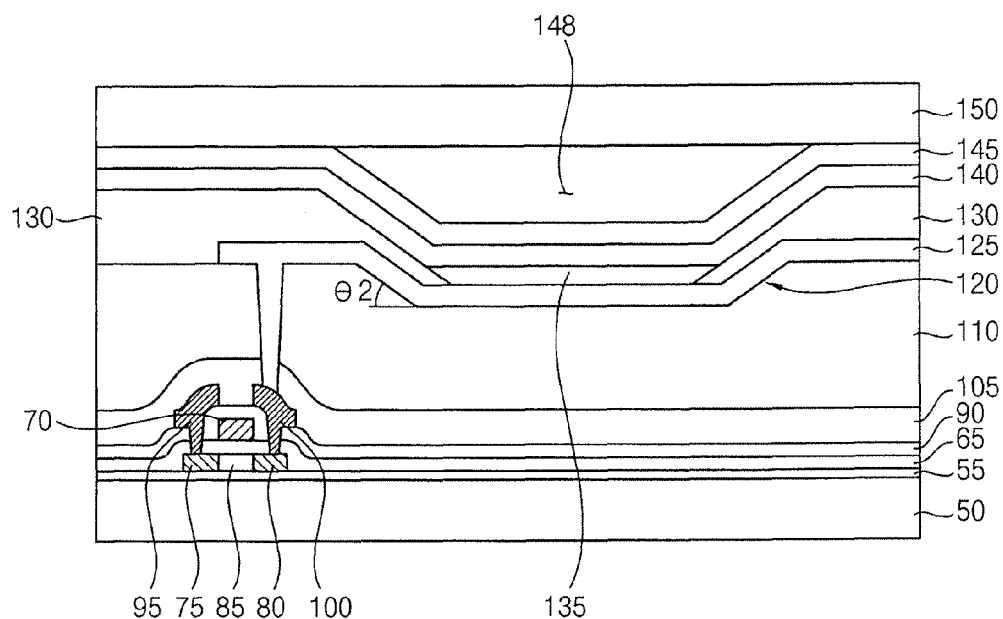

Referring to FIG. 11, a second protection layer 145 may be formed on the second electrode 140. The second protection layer 145 may extend from the luminescent region to the non-luminescent region. The second protection layer 145 may include an organic material or an inorganic material. For example, the second protection layer 145 may be formed using photoresist, acryl-based polymer, polyimide polymer, polyamide-based polymer, siloxane-based polymer, polymer containing photosensitive acrylic carboxyl group, novolak resin, alkali soluble resin, silicon oxide, silicon nitride, silicon oxynitride, silicon oxycarbide, silicon carbon nitride, aluminum, magnesium, zinc, hafnium, zirconium, titanium, tantalum, aluminum oxide, titanium oxide, titanium oxide, tantalum oxide, magnesium oxide, zinc oxide, hafnium oxide, zirconium oxide, etc. These may be used alone or in a combination thereof. Considering ingredients included in the second protection layer 145, the second protection layer 145 may be obtained by a spin coating process, a printing process, a sputtering process, a chemical vapor deposition process, an atomic layer deposition process, a plasma enhanced chemical vapor deposition process, a high density plasma-chemical vapor deposition process, a vacuum evaporation process, etc.

A second substrate 150 may be disposed on the second protection layer 145. The second substrate 150 may include a transparent insulation substrate such as a glass substrate, a transparent plastic substrate, a transparent ceramic substrate, etc. In example embodiments, a space 148 between the second protection layer 145 and the second substrate 150 in the luminescent region may be filled with an air or an inactive gas such as a nitrogen gas. In some example embodiments, the space 148 in the luminescent region may be filled with a resin having a light transmittance and a hygroscopicity.

Figure 12:
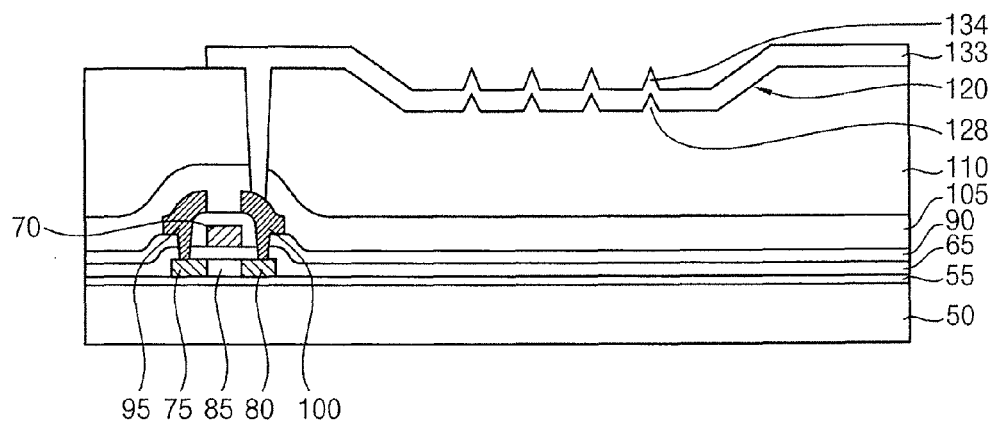
FIGS. 12 and 13 are cross-sectional views illustrating a method of manufacturing an organic light emitting display device in accordance with some example embodiments.
Figure 13:
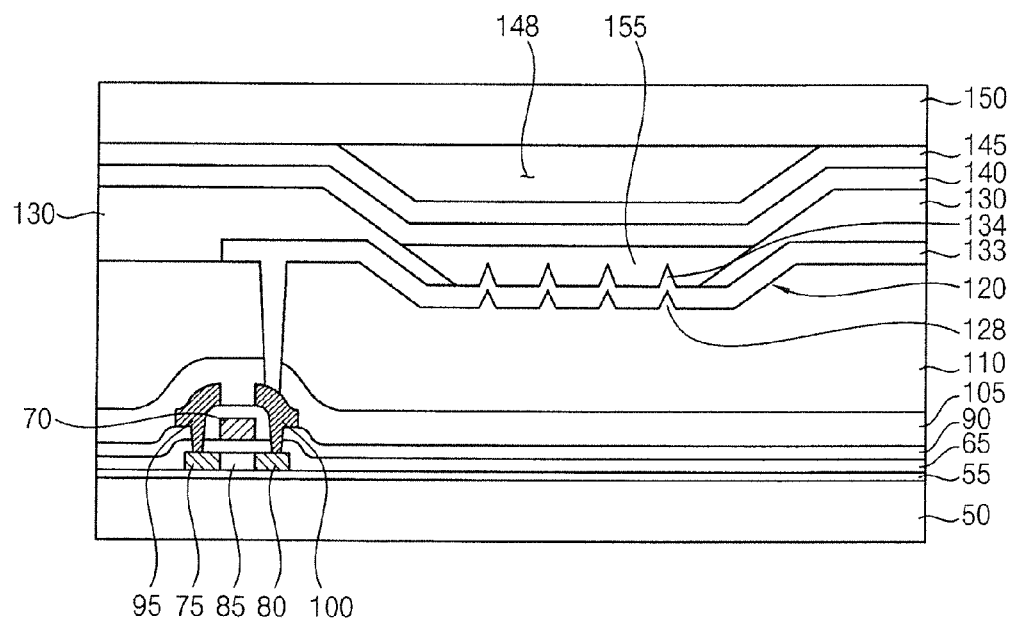

FIGS. 12 and 13 are cross-sectional views illustrating a method of manufacturing an organic light emitting display device in accordance with some example embodiments. The method illustrated in FIGS. 12 and 13 may provide an organic light emitting display device having a configuration substantially the same as or substantially similar to that of the organic light emitting described with reference to FIGS. 5 to 11 except an insulation layer, a first electrode and an organic light emitting structure. However, it is understood by those ordinary skilled in the art that the method may provide other organic light emitting display devices having various configurations of a switching device, a protection layer, an electrode, an insulation layer, an organic light emitting structure, etc.

Referring to FIG. 12, a buffer layer 55, a switching device and a first protection layer 105 may be provided on a first substrate 50 by processes substantially the same as or substantially similar to those described with reference to FIGS. 7 and 8.

An insulation layer 110 may be formed on the first protection layer 105. The insulation layer 110 may include an inclined structure 120 and a hole exposing a portion of a drain electrode 100. A plurality of protrusions 128 may be formed on a bottom of the inclined structure 120 of the insulation layer 110. That is, the protrusions 128 may be formed on a surface of the insulation layer 110 corresponding to the bottom of the inclined structure 120. The inclined structure 120 of the insulation layer 110 may be obtained by processes substantially the same as or substantially similar to those described with reference to FIGS. 1 to 4. In example embodiments, the protrusions 128 of the insulation layer 110 may be formed by performing an exposure process, a developing process and/or a partial etching process on the surface of the insulation layer 110 (i.e., the bottom of the inclined structure 120). Here, the protrusions 128 may be obtained using a half tone mask or a half tone slit mask. For example, each of the protrusions 128 of the insulation layer 110 may have various planar shapes such as a substantially circular shape, a substantially elliptical shape, a substantially cone shape, a substantially diamond shape, a substantially triangular shape, etc. Further, each protrusion 128 may have various three dimensional shapes such as a substantial island shape, a substantial bar shape, a substantial rod shape, a substantial hexahedron shape, etc.

A first electrode 133 filling the hole may be formed on the insulation layer 110 having the inclined structure 120 and the protrusions 128. On the bottom of the inclined structure 120 corresponding to a luminescent region of the organic light emitting display device, the first electrode 133 may have a plurality of protruding portions 134 contacting the protrusions 128, respectively. In addition, a lateral portion of the first electrode 133 located on a sidewall of the inclined structure 120 may have a desired inclination angle. Here, the protruding portions 134 of the first electrode 133 may have shapes substantially the same as or substantially similar to those of the protrusions 128 of the insulation layer 110 because the protruding portions 134 may be caused to be formed from the protrusions 128. In example embodiments, a light generated from an organic light emitting structure 155 (see FIG. 13) may be effectively reflected by the protruding portions 134 of the first electrode 133, so that the organic light emitting display device may have a more enhanced light efficiency.

Referring to FIG. 13, a pixel defining layer 130 may be formed on the insulation layer 110 and the first electrode 133. The pixel defining layer 130 may be formed using an organic material or an inorganic material. The pixel defining layer 130 may be partially etched to form an opening that exposes the protruding portions 134 of the first electrode 133. In this case, a sidewall of the opening of the pixel defining layer 130 may have an inclination angle substantially the same as or substantially similar to that of the sidewall of the inclined structure 120.

As the formation of the opening of the pixel defining layer 130, the luminescent region and a non-luminescent region of the organic light emitting display device may be defined. Here, a first region where the opening of the pixel defining layer 130 is located may be the luminescent region, and a second region adjacent to the first region may be the non-luminescent region. The inclined structure 130 of the insulation layer 110 may be located in the luminescent region, and the first electrode 133 having the protruding portions 134 may be substantially uniformly disposed on the bottom and the sidewall of the inclined structure 120 in the luminescent region. Additionally, the pixel defining layer 130 may extend into the luminescent region, such that the pixel defining layer 130 may locate on the sidewall of the inclined structure 120 and on a portion of the bottom of the inclined structure 120. Thus, a portion of the pixel defining layer 130 in the luminescent region may have an inclination angle substantially the same as or substantially similar to that of the inclined structure 120.

The organic light emitting structure 155 may be formed on the pixel defining layer 130 and the first electrode 133 in the luminescent region. The organic light emitting structure 155 may have a multi layer structure that includes an organic light emitting layer, a hole injection layer, a hole transfer layer, an electron transfer layer, an electron injection layer, etc. The organic light emitting structure 155 may make contact with the first electrode 133 and the pixel defining layer 130 in the luminescent region. Hence, a lateral portion of the organic light emitting structure 155 may have an inclination angle substantially the same as or substantially similar to the inclination angle of the sidewall of the inclined structure 120.

In example embodiments, the first electrode 133 may include the protruding portions 134 in the luminescent region, so that the organic light emitting structure 155 may have a plurality of recesses, grooves or dents substantially corresponding to the protruding portions 134, respectively. That is, a lower portion of the organic light emitting structure 155 may include the recesses, the grooves or the dents having shapes substantially caused from the protruding portions 134 of the first electrode 133. As a result, the organic light emitting structure 155 may have a plurality of portions divided by the protruding portions 134 of the first electrode 133. That is, the organic light emitting structure 155 may be divided into the plurality of portions by the recesses, the grooves or the dents formed from the protruding portions 134 of the first electrode 133.

Referring now to FIG. 13, a second electrode 140 may be formed on the organic light emitting structure 155 and the pixel defining layer 130. The second electrode 140 may include a transparent conductive material in accordance with an emission structure (or emission direction) of the organic light emitting display device. Further, the second electrode 140 in the luminescent region may have an inclination angle substantially the same as or substantially similar to that of the inclined structure 120.

A second protection layer 145 may be formed on the second electrode 140. The second protection layer 145 may extend from the luminescent region into the non-luminescent region. The second protection layer 145 may also be formed using an organic material or an inorganic material.

A second substrate 150 may be provided on the second protection layer 145. The second substrate 150 may include a transparent insulation substrate, for example, a glass substrate, a transparent ceramic substrate, a transparent plastic substrate, etc. A space 148 between the second protection layer 145 and the second substrate 150 may be filled with an air, an inactive gas such as a nitrogen gas, a resin having a light transmittance and a hygroscopicity, etc. In some example embodiments, the second protection layer 145 may not be formed between the second electrode 140 and the second substrate in accordance with an additional filling material in the space 148.

FIGS. 14 to 19 are cross-sectional views illustrating a method of manufacturing an organic light emitting display device in accordance with some example embodiments. The method illustrated in FIGS. 14 to 19 may provide an organic light emitting display device having a configuration substantially the same as or substantially similar to that of the organic light emitting described with reference to FIGS. 5 to 11 except a switching device and an insulation layer having an inclined structure. However, it is understood by those ordinary skilled in the art that the method may provide other organic light emitting display devices having various configurations of a switching device, a protection layer, an electrode, an insulation layer, an organic light emitting structure, etc.

Figure 14:
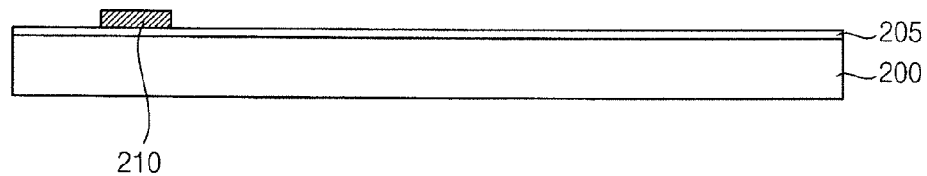
FIGS. 14 to 19 are cross-sectional views illustrating a method of manufacturing an organic light emitting display device in accordance with some example embodiments.

Referring to FIG. 14, a buffer layer 205 may be formed on a first substrate 200, and then a gate electrode 210 may be formed on the buffer layer 205. The buffer layer 205 may be formed on the first substrate 200 by a chemical vapor deposition process, a plasma enhanced chemical vapor deposition process, a spin coating process or a high density plasma-chemical vapor deposition process using a silicon compound.

A gate electrode 210 may be formed using metal, alloy, metal compound and/or a transparent conductive material, and a gate line (not illustrated) may be provided on a portion of the buffer layer 205. The gate electrode 210 and the gate line may be obtained by partially etching a first conductive layer (not illustrated) after forming the first conductive layer on the buffer layer 205. In some example embodiments, the gate electrode 210 and the gate line may be directly formed on the first substrate 200 when the buffer layer 205 is not provided on the first substrate 200.

Figure 15:
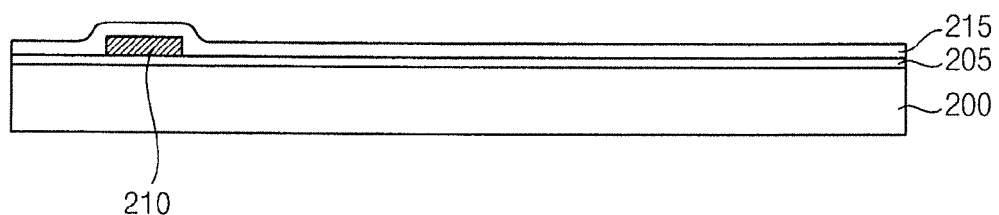

Referring to FIG. 15, a gate insulation layer 215 may be formed on the buffer layer 205 to cover the gate electrode 210. The gate insulation layer 215 may be formed on the buffer layer 205 by a sputtering process, a chemical vapor deposition process, a printing process, a plasma enhanced chemical vapor deposition process, a high density plasma-chemical vapor deposition process, a vacuum evaporation process or a spin coating process using silicon oxide and/or metal oxide.

The gate insulation layer 215 may be substantially uniformly formed on the buffer layer 205 along a profile of the gate electrode 210. Here, the gate insulation layer 215 may have a stepped portion adjacent to the gate electrode 210. In some example embodiments, the gate insulation layer 215 may have a substantially level surface while sufficiently covering the gate electrode 210. To ensure the gate insulation layer 215 having a substantially flat surface, a planarization process including a chemical mechanical polishing process and/or an etch-back process may be performed on the gate insulation layer 215.

Figure 16:
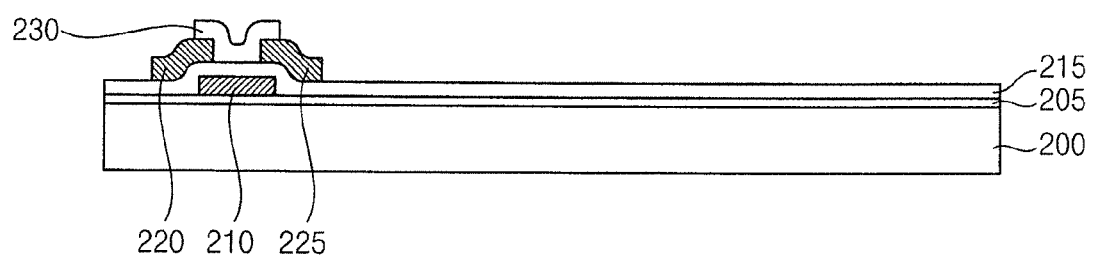

Referring to FIG. 16, a source electrode 220 and a drain electrode 225 may be formed on the gate insulation layer 215. Each of the source and the drain electrodes may be formed using metal, alloy, a metal compound, a transparent conductive material, etc. A date line (not illustrated) may be formed on a portion of the gate insulation layer 215, such that the data line may be connected to the source electrode 220. The data line may extend along a direction substantially perpendicular to that of the gate line. In example embodiments, a second conductive layer (not illustrated) may be formed on the gate insulation layer 215, and then the second conductive layer may be partially etched to provide the data line and the source and drain electrodes 220 and 225 on the gate insulation layer 215. Here, the second conductive layer may be formed by a sputtering process, a vacuum evaporation process, a printing process, a chemical vapor deposition process, an atomic layer deposition process, etc.

The source and the drain electrodes 220 and 225 may be separated from each other by a set or predetermined distance with the gate electrode 210 as the center. When the gate insulation layer 215 has the stepped portion, each of the source and the drain electrodes 220 and 225 may also have a stepped portion caused by the stepped portion of the gate insulation layer 215. After forming the source and the drain electrodes 220 and 225, a portion of the gate insulation layer 215 may be exposed over the gate electrode 210.

An active pattern 230 may be formed on the exposed gate insulation layer 215, the source electrode 220 and the drain electrode 225. The active pattern 230 may be formed using semiconductor oxide. For example, the active pattern 230 may include indium-gallium-zinc oxide (IGZO), gallium zinc oxide (GaZnxOy), indium tin oxide (ITO), indium zinc oxide (IZO), zinc magnesium oxide (ZnMgxOy), zinc tin oxide (ZnSnxOy), zinc zirconium oxide (ZnZrxOy), zinc oxide (ZnOx), gallium oxide (GaOx), titanium oxide (TiOx), tin oxide (SnOx), indium oxide (SnOx), indium-gallium-hafnium oxide (IGHO), tin-aluminum-zinc oxide (TAZO), indium-gallium-tin oxide (IGSO), etc. These may be used alone or in a combination thereof.

In example embodiments, an active layer (not illustrated) may be formed on the source electrode 220, the drain electrode 225 and the gate insulation layer 215, and then the active layer may be patterned to provide the active pattern 230 on the source electrode 220, the gate electrode 225 and the gate insulation layer 215. The active layer may be obtained by a sputtering process, a chemical vapor deposition process, a printing process, a spray process, a vacuum evaporation process, an atomic layer deposition process, a sol-gel process, a plasma enhanced chemical vapor deposition process, etc.

As the formation of the active pattern 230, a switching device may be provided on the first substrate 200. The switching device may include the gate electrode 210, the gate insulation layer 215, the source electrode 220, the drain electrode 225 and the active pattern 230. Here, the switching device may be an oxide semiconductor device.

Figure 17:
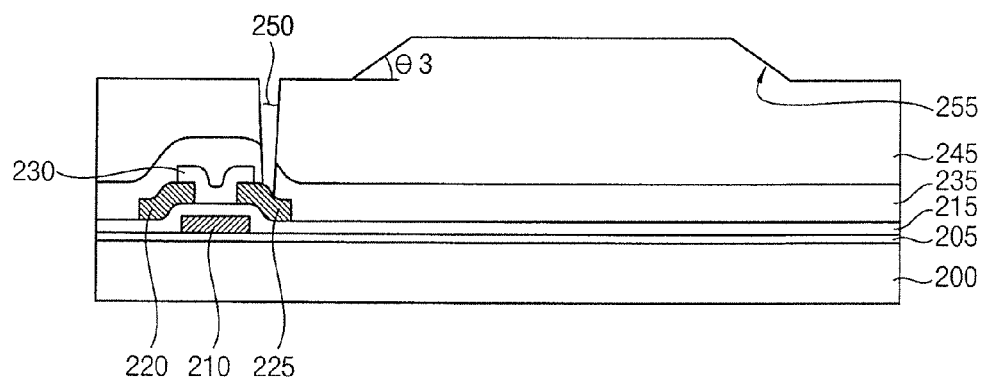

Referring to FIG. 17, a first protection layer 235 may be formed on the gate insulation layer 215 to cover the active pattern 230, the drain electrode 225 and the source electrode 220. The first protection layer 235 may have a relatively large thickness sufficiently covering the active pattern 230. The first protection layer 235 may be formed by a spin coating process, a sputtering process, a printing process, a chemical vapor deposition process, an atomic layer deposition process, a plasma enhanced chemical vapor deposition process, a high density plasma-chemical vapor deposition process or a vacuum evaporation process using an organic material or an inorganic material. In some example embodiments, the first protection layer 235 may not be provided in accordance with ingredients and/or dimensions of an insulation layer 245 successively formed.

The insulation layer 245 may be formed on the first protection layer 235. The insulation layer 245 may have a multi layer structure that includes more than two insulation films. Here, the insulation films of the insulation layer 245 may include materials substantially the same as or substantially similar to those of the first and the second insulation films 5 and 15. In addition, the insulation film of the insulation layer 245 may be formed on the first protection layer 235 by processes substantially the same as or substantially similar to those of forming the first and the second insulation films 5 and 15.

An inclined structure 255 may be formed on the insulation layer 245. A sidewall of the inclined structure 255 may have a fifth inclination angle θ3. In example embodiments, a first insulation film (not illustrated) may be formed on the first protection layer 235, and then first recesses (not illustrated) may be formed on the first insulation film. The first recesses may be spaced apart by a set or predetermined distance. Here, the distance between adjacent first recesses may be substantially the same as or substantially similar to a width of the inclined structure 255 having a protruding shape successively formed. After a second insulation film (not illustrated) may be formed on the first insulation film by interposing the first recesses therebetween, portions of the second insulation film over the first recesses may be etched. Thus, second recesses may be formed through the second insulation film. The second recesses may be communicated with the first recesses. Then, the first and the second insulation films may be reflowed to provide the inclined structure 255 having the protruding shape. In this case, the inclined structure 255 may be positioned between adjacent recesses formed by combinations of the first and the second recesses. For example, the inclined structure 255 may be disposed between adjacent two recesses. The fifth inclination angle θ3 of the inclined structure 255 may be substantially the same as or substantially similar to those of sidewalls of the adjacent recesses. For example, the fifth inclination angle θ3 of the protruding inclined structure 255 may be about 20° to about 70° with respect to a direction substantially parallel to the first substrate 200.

Referring now to FIG. 17, a hole 250 partially exposing the drain electrode 225 may be formed through the insulation layer 245 and the first protection layer 235. Such a hole 250 may be formed while forming the protruding inclined structure 255 on the insulation layer 245. Alternatively, the hole 250 may be formed through the insulation layer 245 and the first protection layer 235 after forming the inclined structure 255.

In example embodiments, the fifth inclination angle θ3 of the sidewall of the inclined structure 255 may be substantially the same as or substantially similar to the third inclination angle θ1 of the sidewall of the inclined structure 25 described with reference to FIG. 4. When the inclined structure 255 of the insulation layer 245 has the protruding shape as illustrated in FIG. 17, the organic light emitting display device may have a bottom emission structure (or bottom emission direction).

Figure 18:
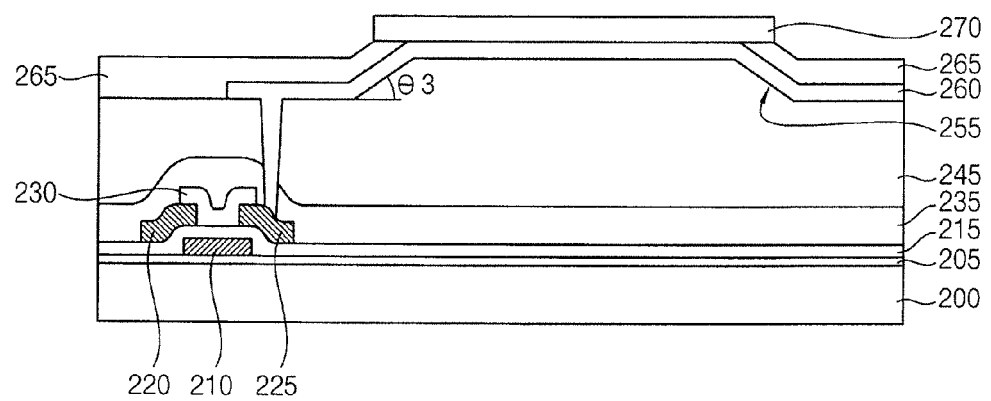

Referring to FIG. 18, a first electrode 260 filling the hole 250 may be formed on the insulation layer 245 having the protruding inclined structure 255. The first electrode 260 may make contact with the drain electrode 225, and may locate on both sidewalls and an upper face of the inclined structure 255. The first electrode 260 may cover the protruding inclined structure 255, so that each of lateral portions of the first electrode 260 may have an inclination angle substantially the same as or substantially similar to the fifth inclination angle θ3 of the sidewall of the inclined structure 255. For example, the lateral portions of the first electrode 260 may have inclination angles in a range of about 20° to about 70° relative to an axis substantially parallel to the first substrate 200.

A pixel defining layer 265 may be formed on the insulation layer 245 and the first electrode 260 to define luminescent and non-luminescent regions of the organic light emitting display device. The pixel defining layer 265 may be formed using an organic material or an inorganic material. The pixel defining layer 265 may extend from the non-luminescent region onto the sidewalls of the inclined structure 255 in the luminescent region. That is, the pixel defining layer 265 may not be disposed on the upper face of the inclined structure 255. The pixel defining layer 265 may be positioned on the first electrode 260 positioned on the sidewalls of the inclined structure 255, such that each of lateral portions of the pixel defining layer 265 may have an inclination angle substantially the same as or substantially similar to the fifth inclination angle θ3 of the sidewall of the inclined structure 255.

An organic light emitting structure 270 may be formed on the first electrode 260 and a portion of the pixel defining layer 265. The organic light emitting structure 270 may have a multi layer structure that includes an organic light emitting layer. Although the organic light emitting structure 270 may include various light emitting materials in accordance with pixels of the organic light emitting display device, the organic light emitting structure 270 may include stacked light emitting materials for generating a white color of light.

In example embodiments, the organic light emitting structure 270 may be disposed in the luminescent region only. For example, the organic light emitting structure 270 may be formed on the upper face of the inclined structure 255 and the portion of the pixel defining layer 265 in the luminescent region. Hence, each of lateral portions of the organic light emitting structure 270 may have a relatively large inclination angle. For example, the lateral portion of the organic light emitting structure 270 may have an inclination angle in a range of about 40° to about 90° with respect to the axis substantially parallel to the first substrate 200. As a result, a ratio between the lateral portion of the organic light emitting structure 270 and the sidewall of the inclined structure 255 or the lateral portion of the pixel defining layer 265 may be in a range of about 1.0:0.2 to about 1.0:1.8.

Figure 19:
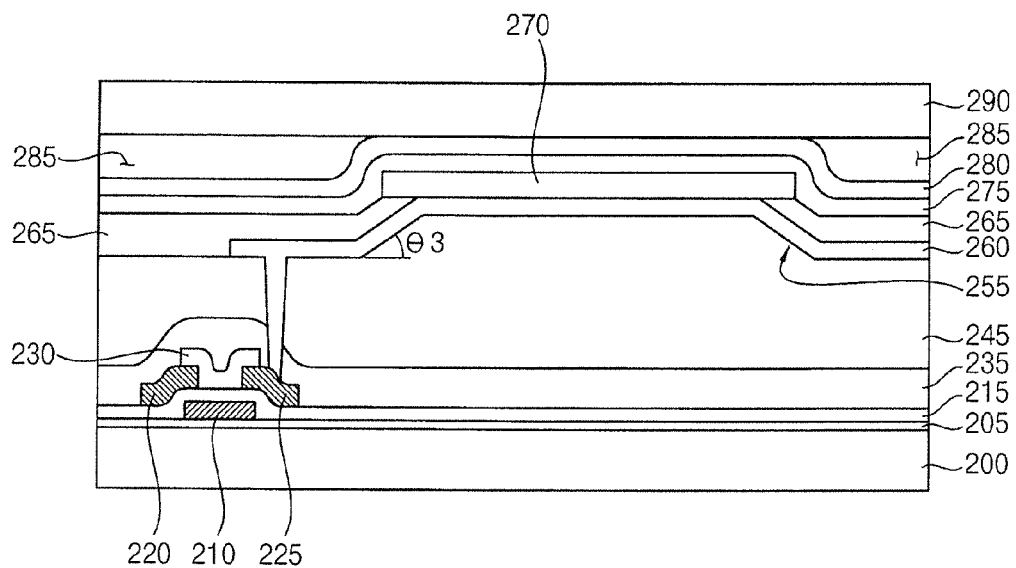

Referring to FIG. 19, a second electrode 275 may be formed on the pixel defining layer 265 and the organic light emitting structure 270. When the organic light emitting display device has the bottom emission structure, the second electrode 275 may include a reflective material. The second electrode 275 may be substantially uniformly formed on the pixel defining layer 265 and the organic light emitting structure 270. Here, a portion of the second electrode 275 adjacent to the sidewall of the inclined structure 270 may have an inclination angle substantially the same as or substantially similar to the fifth inclination angle θ3 of the inclined structure 255.

A second protection layer 280 may be formed on the second electrode 275. The second protection layer 280 may include an organic material or an inorganic material, and may extend from the luminescent region to the non-luminescent region. A second substrate 290 may be disposed on the second protection layer 280. Here, a set or predetermined space 285 may be created between the second protection layer 280 and the second substrate 290. This space 285 may be filled with an air or an inactive gas, for example, a nitrogen gas. Alternatively, the space 285 may be filled with a resin having a light transmittance and a hygroscopicity. In some example embodiments, the second protection layer 280 may not be provided between the second electrode 275 and the second substrate 290 in case an additional filling material may be formed on the second electrode 275.

According to example embodiments, each of lateral portions of the first electrode 260, the pixel defining layer 265 and the second electrode 275 may have a desired inclination angle for preventing a total reflection of light generated from the organic light emitting structure 270 because of the inclined structure 255 having the protruding shape. Therefore, the organic light emitting display device may have a greatly improved light efficiency.

Figure 20:
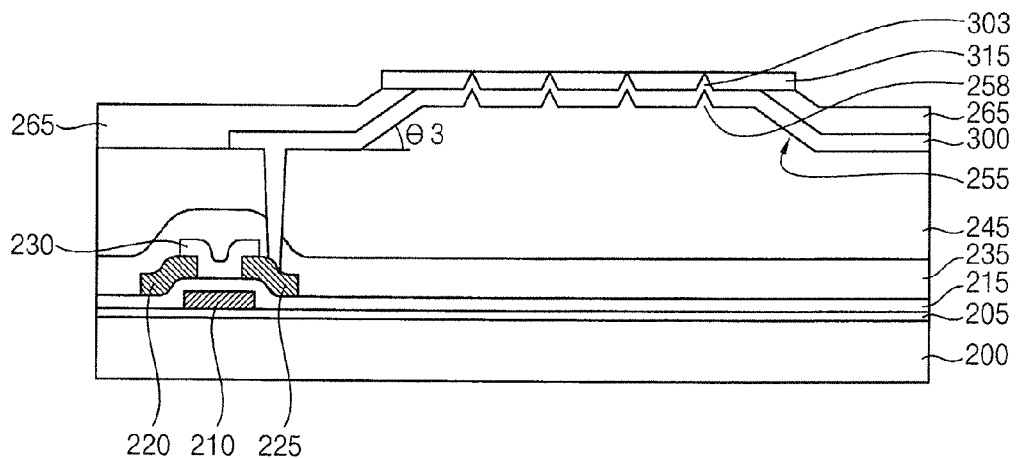
FIGS. 20 and 21 are cross-sectional views illustrating a method of manufacturing an organic light emitting display device in accordance with some example embodiments.
Figure 21:
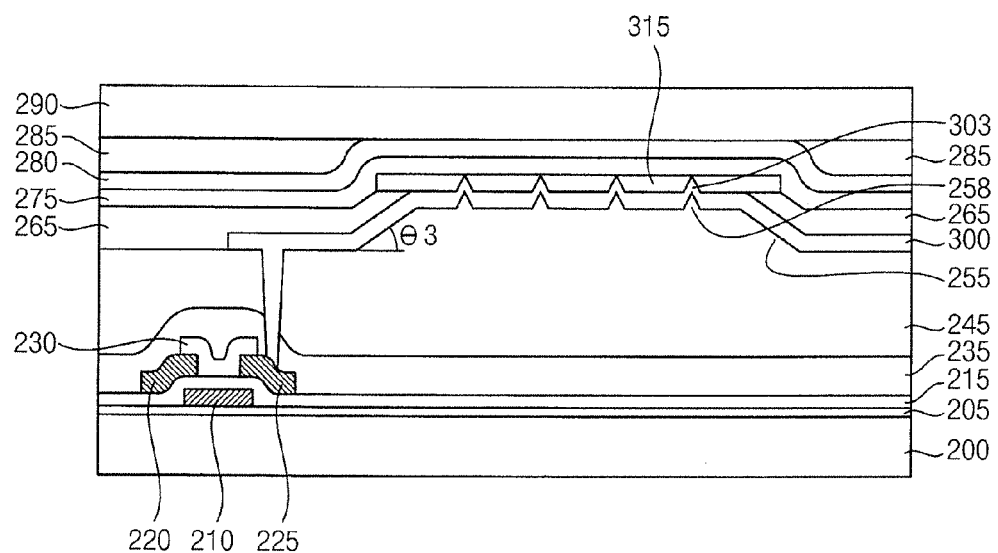

FIGS. 20 and 21 are cross-sectional views illustrating a method of manufacturing an organic light emitting display device in accordance with some example embodiments. The method illustrated in FIGS. 20 to 21 may provide an organic light emitting display device having a configuration substantially the same as or substantially similar to that of the organic light emitting described with reference to FIGS. 5 to 11 except an insulation layer, a first electrode and an organic light emitting structure. However, it is understood by those ordinary skilled in the art that the method may provide other organic light emitting display devices having various configurations of a switching device, a protection layer, an electrode, an insulation layer having an inclined structure, an organic light emitting structure, etc.

Referring to FIG. 20, a switching device, a first protection layer 235 and an insulation layer 245 having an inclined structure 255 may be formed on a first substrate 200 by processes substantially the same as or substantially similar to the processes described with reference to FIGS. 14 to 17.

As illustrated in FIG. 20, a plurality of protrusions 258 may be formed on the protruding inclined structure 255 by carrying out processes substantially the same as or substantially similar to the processes described with reference to FIG. 12. Thus, the insulation layer 245 may have the plurality of protrusions 258, and each of sidewalls of the protruding inclined structure 255 may have a fifth inclination angle θ3.

A first electrode 300 may be formed on the insulation layer 245 having the inclined structure 255 to fill up a hole formed through the insulation layer 245 and the first protection layer 235. Each of lateral portions of the first electrode 300 may have an inclination angle substantially the same as or substantially similar to the fifth inclination angle θ3 of the sidewall of the inclined structure 255. Further, the first electrode 300 may have a plurality of protruding portions 303 caused by the protrusions 258 of the insulation layer 245.

A pixel defining layer 265 for defining luminescent and non-luminescent regions may be formed on the first electrode 300 and the insulation layer 245. The pixel defining layer 265 may extend from the non-luminescent region onto the sidewalls of the inclined structure 255 positioned in the luminescent region. The pixel defining layer 265 may be located on the first electrode 300 positioned on the sidewalls of the protruding inclined structure 255, so that lateral portions of the pixel defining layer 265 may have an inclination angle substantially the same as or substantially similar to the fifth inclination angle θ3 of the sidewall of the inclined structure 255.

An organic light emitting structure 315 may be formed on the first electrode 300 and the pixel defining layer 265. In example embodiments, the organic light emitting structure 315 may be disposed only on an upper face of the protruding inclined structure 255 and a portion of the pixel defining layer 265. Thus, each of lateral portions of the organic light emitting structure 315 may have a relatively large inclination angle. When the organic light emitting structure 315 is formed on the first electrode 300 having the protruding portions 303, the organic light emitting structure 315 may include a plurality of recesses, grooves or dents substantially corresponding to the protruding portions 303. Therefore, the organic light emitting structure 315 may be divided into a plurality of portions by the recesses, the grooves or the dents.

Referring to FIG. 21, a second electrode 275 may be formed on the pixel defining layer 265 and the organic light emitting structure 315. In case the organic light emitting display device has a bottom emission structure, the second electrode 275 may include a reflective material. The second electrode 275 may be uniformly disposed on the pixel defining layer 265 and the organic light emitting structure 315 along a profile of the organic light emitting structure 315. Additionally, a portion of the second electrode 275 adjacent to the sidewall of the inclined structure 255 may have an inclination angle substantially the same as or substantially similar to the fifth inclination angle θ3.

A second protection layer 280 may be formed on the second electrode 275. The second protection layer 280 may be disposed in both the luminescent region and the non-luminescent region. A second substrate 290 may be provided on the second protection layer 280 while a predetermined space 285 may be interposed between the second protection layer 280 and second substrate 290. However, the second protection layer 280 may not be formed on the second electrode 275 when an additional filling material or a filling layer is interposed between the second electrode 275 and the second substrate 290.

Figure 22:
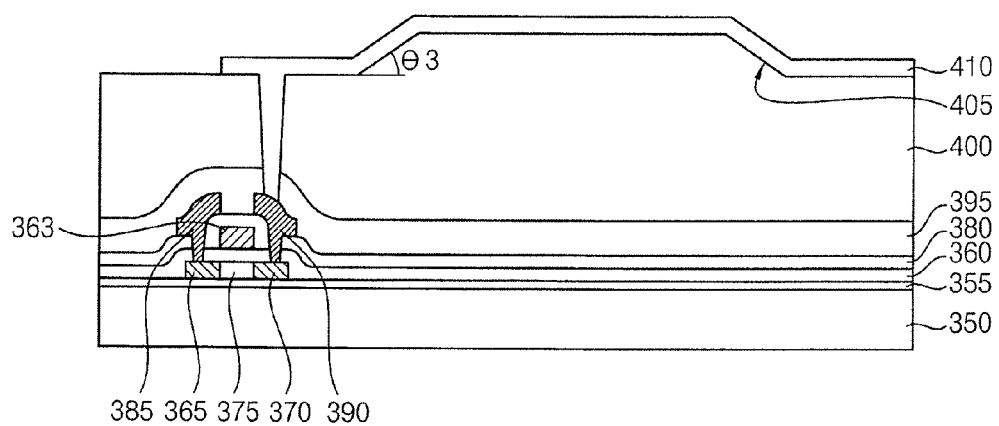
FIGS. 22 to 24 are cross-sectional views illustrating a method of manufacturing an organic light emitting display device in accordance with some example embodiments.
Figure 23:
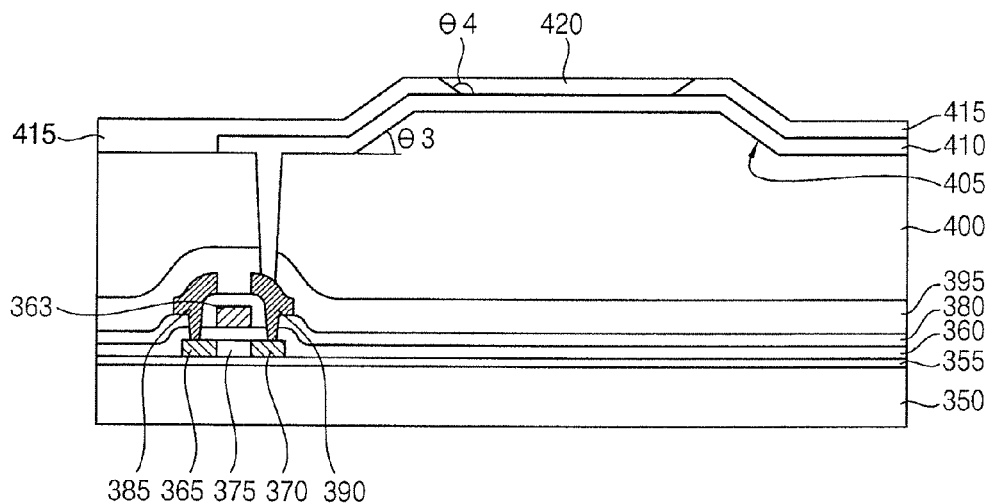
Figure 24:
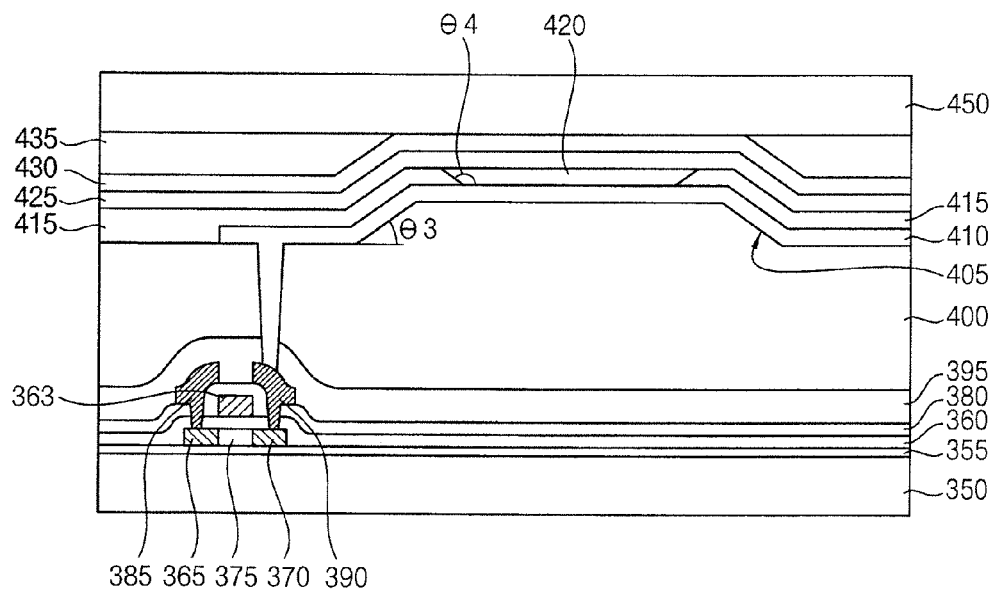

FIGS. 22 to 24 are cross-sectional views illustrating a method of manufacturing an organic light emitting display device in accordance with some example embodiments. The method illustrated in FIGS. 22 to 24 may provide an organic light emitting display device having a configuration substantially the same as or substantially similar to that of the organic light emitting described with reference to FIGS. 5 to 11 except an insulation layer having an inclined structure, a first electrode, a pixel defining layer and an organic light emitting structure. However, it is understood by those ordinary skilled in the art that the method may provide other organic light emitting display devices having various configurations of a switching device, a protection layer, an electrode, an insulation layer, an organic light emitting structure, etc.

Referring to FIG. 22, a buffer layer 355, a switching device and a first protection layer 395 may be formed on a first substrate 350 by processes substantially the same as or substantially similar to the processes described with reference to FIGS. 7 and 8. Here, the switching device may include a semiconductor pattern, a gate insulation layer 360, a gate electrode 363, an insulation interlayer 380, a source electrode 385 and a drain electrode 390. The semiconductor pattern of the switching device may be divided into a source region 365, a drain region 370 and a channel region 375.

An insulation layer 400 having a protruding inclined structure 405 may be formed on the first protection layer 395. Further, the insulation layer 400 may include a hole exposing a portion of the drain electrode 390. The insulation layer 400 may have a multi layer structure that includes at least two insulation films. These insulation films of the insulation layer 400 may be formed using materials substantially the same as or substantially similar to those of the first and the second insulation films 5 and 15 described with reference to FIGS. 1 and 2. Additionally, the insulation films of the insulation layer 400 may be obtained by processes substantially the same as or substantially similar to the processes for forming the first and the second insulation films 5 and 15 described with reference to FIGS. 1 and 2.

In example embodiments, a first insulation film (not illustrated) and a second insulation film (not illustrated) may be formed on the first protection layer 395. The first and the second insulation films may have substantially level surfaces, respectively. First recesses (not illustrated) may be formed on the second insulation film by a predetermined distance. Here, the distance between adjacent first recesses may be substantially the same as or substantially similar to a width of the inclined structure 405 successively formed. A third insulation film (not illustrated) may be formed on the second insulation film while the first recesses are interposed between the second and the third insulation films. The, portions of the third insulation film over the first recesses may be removed to form second recesses through the third insulation film. Each of the second recesses may be communicated with a related first recess. After reflowing the second and the third insulation films, the protruding inclined structure 405 may be provided on the insulation layer 400. The protruding inclined structure 405 may be disposed between adjacent first recesses or adjacent second recesses. In case the inclined structure 405 of the insulation layer 400 has the protruding shape, the organic light emitting display device may have a bottom emission structure. A sidewall of the inclined structure 405 may have a fifth inclination angle $\theta 3$ substantially the same as or substantially similar to inclination angles of adjacent recesses formed by combinations of the first and the second recesses. For example, the sidewall of the inclined structure 405 may have the fifth inclination angle $\theta 3$ in a range of about 20° to about 70° with respect to a direction substantially parallel to the first substrate 350.

A first electrode 410 may be formed on the insulation layer 400 having the protruding inclined structure 405 while filling a hole formed through the insulation layer 400 to partially expose the drain electrode 390. In example embodiments, a first electrode layer (not illustrated) may be formed on the insulation layer 400 to fill up the hole, and then an etching mask (not illustrated) may be formed on the first electrode layer. The first electrode layer may be patterned using the etching mask, such that first electrodes 410 separated in adjacent pixel regions may be formed on the insulation layer 400. Each of the first electrodes 410 may make contact with the drain electrode 390 and may locate on the sidewall and an upper face of the protruding inclined structure 405. Since the first electrode 410 is disposed on the protruding inclined structure 405, lateral portions of the first electrode 410 may have inclination angles substantially the same as or substantially similar to the fifth inclination angle $\theta 3$ of the inclined structure 405. For example, each lateral portion of the first electrode 410 may have an inclination angle in a range of about 20° to about 70° with respect to an axis substantially parallel to the first substrate.

Referring to FIG. 23, a pixel defining layer 415 may be formed on the first electrode 410 and the insulation layer 400 to define a luminescent region and a non-luminescent region of the organic light emitting display device. The pixel defining layer 415 may be formed using an organic material or an inorganic material. The pixel defining layer 415 may extend from the non-luminescent region onto the inclined structure 405 positioned in the luminescent region.

In example embodiments, the pixel defining layer 415 may extend to cover the first electrode 410 in the luminescent region. In this case, an opening may be formed though the pixel defining layer 415 to expose the first electrode 410 positioned on the upper face of the inclined structure 405. The opening of the pixel defining layer 415 may include a sidewall having a sixth inclination angle $\theta 4$ substantially different from the fifth inclination angle $\theta 3$ of the sidewall of the inclined structure 405. For example, the sidewall of the opening of the pixel defining layer 415 may have the sixth inclination angle $\theta 4$ in a range of about 110° to about 160° relative to the direction substantially parallel to the first substrate 350. This pixel defining layer 415 having the opening may define the luminescent region of the organic light emitting display device. Also, later portions of the pixel defining layer 415 disposed on the sidewalls of the inclined structure 405 may have inclination angles substantially the same as or substantially similar to the fifth inclination angle $\theta 3$.

An organic light emitting structure 420 may be formed on the first electrode 410 in the opening of the pixel defining layer 415. In example embodiments, the organic light emitting structure 420 may be buried (filled) in the opening of the pixel defining layer 415. That is, the organic light emitting structure 420 may fully fill the opening of the pixel defining layer 415, and may have a substantially level surface. Thus, a sidewall of the organic light emitting structure 420 may have an inclination angle substantially the same as or substantially similar to the sixth inclination angle $\theta 4$ of the sidewall of the opening. For example, the sidewall of the organic light emitting structure 420 may have an inclination angle in a range of about 110° to about 160° with respect to the axis substantially parallel to the first substrate 350. Therefore, a ratio of the sidewall of the organic light emitting structure 420 relative to the sidewall of the protruding inclined structure 405, the later portion of the first electrode 410 or the lateral portion of the pixel defining layer 415 may be in a relatively large range of about 1.0:1.6 to about 1.0:8.0. In pixels of the organic light emitting display device, the organic light emitting structure 420 may have a multi layer structure including an organic light emitting layer. The organic light emitting structures 420 may include different light emitting materials, respectively. Alternatively, all of the organic light emitting structures 420 may include stacked light emitting materials for generating a white color of light.

Referring to FIG. 24, a second electrode 425 may be formed on the pixel defining layer 415 and the organic light emitting structure 420. When the organic light emitting display device has a bottom emission structure, the second electrode 425 may include a reflective material. The second electrode 425 may be substantially uniformly formed on the pixel defining layer 415 and the organic light emitting structure 420. In this case, a portion of the second electrode 425 adjacent to the sidewall of the protruding inclined structure 405 may have an inclination angle substantially the same as or substantially similar to the fifth inclination angle θ3.

A second protection layer 430 may be formed on the second electrode 425. The second protection layer 430 may include an organic material or an inorganic material, and may extend from the luminescent region to the non-luminescent region. A second substrate 450 including a transparent insulation substrate may be disposed on the second protection layer 430. Here, a set or predetermined space 435 may be provided between the second protection layer 430 and the second substrate 450 in the luminescent region. Although an air or an inactive gas such as a nitrogen gas may fill up the space 435, a resin having a light transmittance and a hygroscopicity may fill up such a space 435 as occasion demands. In some example embodiments, the second protection layer 430 may not be formed between the second electrode 425 and the second substrate 450 in accordance with an additional filling material in the space 435.

According to example embodiments, the protruding inclined structure 405 may provide the lateral portions of the first electrode 410, the pixel defining layer 415 and the second electrode 425 having desired inclination angles for preventing a total reflection of light generated from the organic light emitting structure 420. Hence, the organic light emitting display device may ensure a considerably enhanced light efficiency. Additionally, the organic light emitting structure 420 may be buried in the opening of the pixel defining layer 415, so that the light progressing into the non-luminescent region may be reflected toward the luminescent region by the second electrode 425 disposed over the inclined structure 405 having the protruding shape.

According to example embodiments of the invention, an organic light emitting display device may include an insulation layer having an inclined structure of a recessed shape or a protruding shape without any additional structure for the optical resonance of the light generated from an organic light emitting structure. Therefore, the organic light emitting display device may have a light efficiency considerably greater than that of the conventional organic light emitting display device. As s result, the organic light emitting display device may display an image with an improved luminance, an enhanced contrast, an increased viewing angle, etc.

The foregoing is illustrative of example embodiments, and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to the specific embodiments disclosed, and that modifications to the disclosed example embodiments, as well as other example embodiments, are intended to be included within the scope of the appended claims. The invention is defined by the following claims, with equivalents of the claims to be included therein.

What is claimed is:

1. An organic light emitting display device comprising:
   a first substrate;
   an insulation layer on the first substrate, the insulation layer comprising an inclined structure;
   a first electrode on the insulation layer;
   a pixel defining layer on the insulation layer and the first electrode, the pixel defining layer defining a luminescent region and a non-luminescent region;
   an organic light emitting structure on the first electrode in the luminescent region and having an entire upper surface that is planar;
   a second electrode on the pixel defining layer and the organic light emitting structure; and
   a second substrate on the second electrode,
      wherein the pixel defining layer extends on a portion of the first electrode positioned on a sidewall of the inclined structure, and
      wherein a sidewall of the inclined structure has an inclination angle the same as an inclination angle of a sidewall of the organic light emitting structure.

2. The organic light emitting display device of claim 1, wherein the pixel defining layer extends on the first electrode positioned on an upper face of the inclined structure, and the pixel defining layer has an opening exposing the first electrode in the luminescent region.

3. The organic light emitting display device of claim 2, wherein the organic light emitting structure is disposed in the opening of the pixel defining layer.

4. The organic light emitting display device of claim 3, wherein the sidewall of the organic light emitting structure has an inclination angle of about 110° to about 160° relative to a direction in parallel to the first substrate.

5. The organic light emitting display device of claim 1, wherein the sidewall of the inclined structure has an inclination angle of about 20° to about 70° relative to a direction parallel to the first substrate.

6. The organic light emitting display device of claim 5, wherein each of lateral portions of the first and the second electrodes on the inclined structure has an inclination angle the same as the inclination angle of the sidewall of the inclined structure.

7. The organic light emitting display device of claim 1, wherein the insulation layer has a plurality of protrusions on the inclined structure.

8. The organic light emitting display device of claim 7, wherein the first electrode has a plurality of protruding portions formed on the plurality of protrusions, respectively.

9. The organic light emitting display device of claim 8, wherein the organic light emitting structure has a plurality of portions divided by the protruding portions of the first electrode.

10. The organic light emitting display device of claim 1, wherein the inclined structure has a recessed shape.

* * * * *